(12) United States Patent
Voronin et al.

(10) Patent No.: US 12,525,437 B2
(45) Date of Patent: Jan. 13, 2026

(54) SUBSTRATE BOMBARDMENT WITH IONS HAVING TARGETED MASS USING PULSED BIAS PHASE CONTROL

(71) Applicant: Tokyo Electron Limited, Tokyo (JP)

(72) Inventors: Sergey Voronin, Albany, NY (US); Qi Wang, Albany, NY (US); Hamed Hajibabaeinajafabadi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 455 days.

(21) Appl. No.: 17/945,408

(22) Filed: Sep. 15, 2022

(65) Prior Publication Data

US 2024/0096600 A1 Mar. 21, 2024

(51) Int. Cl.
*H01J 37/32* (2006.01)
*H01L 21/3065* (2006.01)

(52) U.S. Cl.
CPC ... *H01J 37/32422* (2013.01); *H01J 37/32211* (2013.01); *H01L 21/3065* (2013.01); *H01J 37/32935* (2013.01); *H01J 2237/334* (2013.01)

(58) Field of Classification Search
None
See application file for complete search history.

(56) References Cited

U.S. PATENT DOCUMENTS

| | | |
|---|---|---|
| 2013/0052811 A1 | 2/2013 | Koo |
| 2017/0032937 A1 | 2/2017 | Distaso et al. |
| 2017/0280548 A1 | 9/2017 | Scholtz et al. |
| 2020/0135458 A1 | 4/2020 | Mehrotra et al. |
| 2022/0051875 A1* | 2/2022 | Voronin .............. H01L 21/3065 |

OTHER PUBLICATIONS

Voronin, S.A., et al., "The role of ions in thin film deposition in a pulsed acrylic acid discharge," 18th International Symposium on Plasma Chemistry, Aug. 26-31, 2007, 4 pages.
International Searching Authority, "Notification of Transmittal of the International Search Report and the Written Opinion of the International Searching Authority, or the Declaration," PCT/US2023/027464, Oct. 30, 2023, 9 pages.

* cited by examiner

*Primary Examiner* — Joshua L Allen
*Assistant Examiner* — Andrew Keelan Laobak
(74) *Attorney, Agent, or Firm* — Slater Matsil, LLP

(57) ABSTRACT

A method of plasma processing includes generating plasma by coupling a source power pulse to a plasma processing chamber containing a substrate holder configured to support a substrate. The plasma includes first ions having a first mass and second ions having a second mass greater than the first mass. The ion density ratio of the second ions to the first ions is a first ratio. The method further includes delivering an energetic ion flux of second ions to the substrate by applying a delayed bias power pulse to the substrate holder after a delay between the source power pulse and the delayed bias power pulse. The delay is chosen based on the diffusion time constants of the first ions and the second ions so that the ion density ratio of the second ions to the first ions is a second ratio that is greater than the first ratio.

20 Claims, 14 Drawing Sheets

SUBSTRATE BOMBARDMENT WITH IONS HAVING TARGETED MASS USING PULSED BIAS PHASE CONTROL

TECHNICAL FIELD

The present invention relates generally to plasma processing, and, in particular embodiments, to methods and systems for plasma processing that use bias pulses to bombard a substrate with ions having a targeted mass.

BACKGROUND

Electronic device fabrication within a substrate such as an integrated circuit within a semiconductor substrate typically involves a series of manufacturing techniques including formation, patterning, and removal of a number of layers of material on the substrate. There is a consistent and continuous push to improve the fabrication processes, features, and capabilities of microscale (and smaller) electronics. To provide improvements beyond the limitations of the current technology, novel developments such as new chemistry and new advanced methods for process control may be required.

Plasma processing is used in electronic device fabrication for many manufacturing techniques, such as deposition and etching. Pulsed plasma processing methods may utilize pulses of source power (SP) and/or bias power (BP) to control various parameters during plasma processing. For instance, radio frequency (RF) power or direct current (DC) power may be pulsed. RF power may also be combined with a DC offset, such as when applying bias pulses to an electrode.

The plasma may include various species mixed together within a plasma processing chamber. Additionally, each species within the plasma may generate a variety of plasma products such as ions, radicals, electrons, and dissociation products. The plasma products of each species may have different properties and be included for different purposes in the plasma. For example, plasma products of different species can have different chemical properties that may include differing reactivity relative to various materials of a substrate being processed. Further, the species within the plasma (and consequently the corresponding plasma products) may have a broad range of different masses, in addition to many other distinguishing features.

Control over individual species and species products within plasma may be advantageous to maximize respective roles of the species during plasma processing. For instance, it may be desirable to control relative flux rates of various energetic plasma products at a substrate in order to further optimize desirable parameters such as selectivity, etch profile, critical dimension, and others. In particular, ions with different properties and different roles in a given plasma process may have different masses. At certain times during the plasma process, one or more species of energetic heavier ions may have properties (chemical, physical, etc.) that are beneficial at the substrate while other energetic lighter ions may have detrimental properties. Therefore, methods and apparatuses that can preferentially deliver heavy ions to a substrate during a plasma process may be desirable.

SUMMARY

In accordance with an embodiment of the invention, a method of plasma processing includes generating plasma by coupling a source power pulse to a plasma processing chamber containing a substrate holder configured to support a substrate. The plasma is contained in the plasma processing chamber. The plasma includes first ions that have a first mass and second ions that have a second mass. The second mass is greater than the first mass. The ion density ratio of the second ions to the first ions is a first ratio. The method further includes delivering an energetic ion flux of second ions to the substrate by applying a delayed bias power pulse to the substrate holder after a delay between the source power pulse and the delayed bias power pulse. The delay is chosen based on the diffusion time constant of the first ions and the diffusion time constant of the second ions so that the ion density ratio of the second ions to the first ions is a second ratio that is greater than the first ratio.

In accordance with another embodiment of the invention, a method of plasma processing includes generating plasma by coupling a first source power pulse to a plasma processing chamber containing a substrate holder configured to support a substrate. The plasma is contained in the plasma processing chamber. The plasma includes first ions that have a first mass and second ions that have a second mass. The second mass is greater than the first mass. The method further includes collecting measurements indicative of ion density in the plasma, calculating a delay according to ion diffusion time constants determined from the measurements, generating plasma including the first ions and the second ions by coupling a second source power pulse to the plasma processing chamber, and delivering an energetic ion flux including the second ions to the substrate by applying a bias power pulse to the substrate holder after the delay. The delay is between the second source power pulse and the bias power pulse.

In accordance with still another embodiment of the invention, a plasma processing apparatus includes a plasma processing chamber configured to contain a plasma including first ions that have a first mass and second ions that have a second mass. The second mass is greater than the first mass. The plasma processing apparatus further includes a source power supply configured to couple source power pulses to the plasma processing chamber to generate the plasma, a metrology component operatively coupled to the plasma and configured to collect measurements indicative of ion density in the plasma, a controller coupled to the metrology component and configured to calculate a delay according to ion diffusion time constants determined from the measurements, a substrate holder disposed within the plasma processing chamber and configured to support a substrate, and a bias power supply coupled to the controller and the substrate, the bias power supply being configured to apply a bias power pulse to the substrate holder after the delay to deliver an energetic ion flux including the second ions to the substrate. The delay is between a source power pulse and the bias power pulse.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
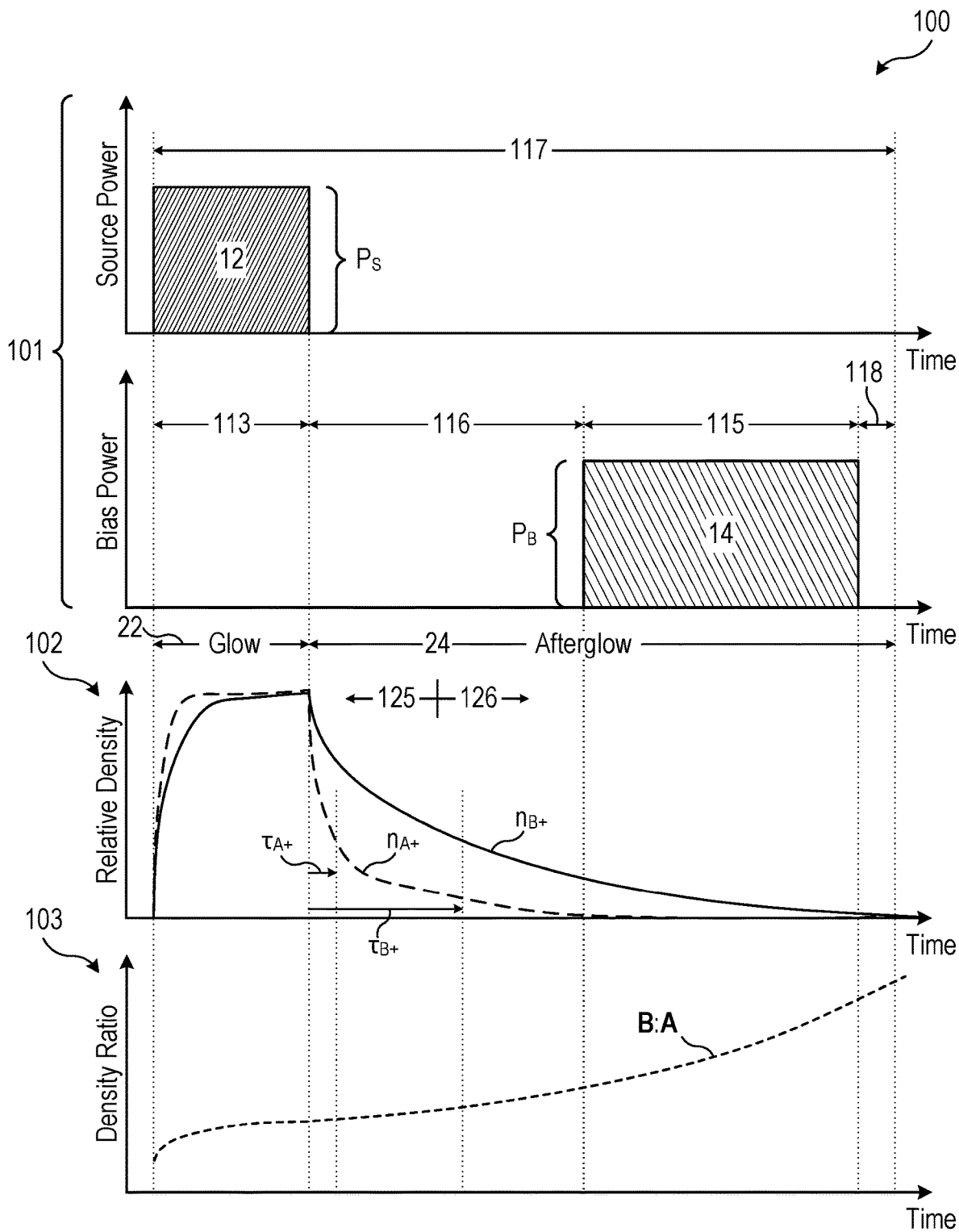
FIG. 1 schematically illustrates an example plasma process utilizing a delayed bias power pulse to deliver an energetic ion flux having an increased flux of heavier ions relative to a flux of lighter ions in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

Plasma processing technologies are constantly being refined and developed in order achieve increased precision in both material etching and deposition. In certain areas, such as atomic layer etching (ALE), new processes and tools are being developed to this end. Continued application of Moore's law in the semiconductor industry requires processing of features at nanometer scales. However, the margin for error during nanoscale etch and deposition processes is very small. Consequently, improved precision in energy control and bombardment of ions from the process plasma is desirable to achieve accurate etch and deposition of materials.

Various species are included in a process plasma for different reasons. Precursor gases may include species that form ions and radicals in the process plasma to facilitate processing of the substrate. In the simplest case, a given species may be ionized in the plasma to form ions or broken into fragments that form radicals. In more complicated cases, multiple species or fragments of species interact to form complex dissociation products.

Each precursor species, ionic species, and radical species in the plasma has unique chemical and physical properties. For example, different ionic species may have different reactivity thresholds relative to substrate materials such as mask materials and target materials (i.e. different etch properties). Additionally, different ionic species may have different masses. In one specific example, it may be desirable to increase the flux of a heavier ion $B^+$ at a targeted energy to the substrate while decreasing the flux of a lighter ion $A^+$ at that energy. For example, both ions may be included in the plasma for different reasons, but providing the lighter ion at the substrate at the same time as the heavier ion may decrease selectivity.

Since $A^+$ and $B^+$ both have a positive charge, both will be accelerated towards a negative bias voltage applied to a substrate. However, heavier ions have longer diffusion times which results in increasing average ion mass over the duration of the OFF period (e.g. the afterglow phase) of a pulsing plasma discharge. Specifically, lighter ions diffuse to the chamber walls faster than heavier ions once the plasma source power is removed. Therefore, applying accelerating voltage to the process target substrate in particular periods of the plasma pulse cycle when the ion density of $B^+$ is higher than the ion density of $A^+$ facilitates preferential energetic bombardment of the substrate by the heavier $B^+$ ions.

Such periods of the plasma pulse cycle that have sufficient heavy ion density combined with negligible or inconsequential density of lighter ions occur later in the OFF period after the lighter ions have had time to diffuse. The inventors have determined that the specific time during which to apply the bias power to provide the desired ratio of heavy to light ions with the desired ion flux at the desired energy depends on factors such as the diffusion times of the ionic species. The plasma processing methods and apparatuses described herein may advantageously solve the problem of controllably increasing the flux of a heavier ionic species relative to the flux of lighter ionic species within an energetic ion flux by applying a delayed bias power pulse after source power has been removed where the delay is based on the diffusion times of the ionic species.

Many other advantages may also be attained by using the various plasma methods and apparatuses described herein. While there could be many reasons why a heavier ionic species is desirable while one or more lighter ionic species are not, one specific reason may be that the lighter ions decrease selectivity by etching mask material. In this specific example, reducing or eliminating the energetic flux of the lighter ionic species while providing a desirable energetic flux of the heavier ionic species may have the advantage of etching the target material with increased selectivity.

Without the ability to preferentially deliver the heavy ions at a targeted energy, there would be an undesirable tradeoff between including the light ions in the plasma to achieve benefits for one purpose and excluding the light ions from the plasma to prevent detriments for another purpose. With the preferential delivery of heavy ions, the light ions can advantageously be included in the plasma to achieve the benefits without suffering the detriments. In the context of the above examples, both ions $A^+$ and $B^+$ can be included in the plasma while still achieving selective etching of the target material.

One possible benefit of improved control over the ratio of heavier ionic species to lighter ionic species is to improve process flexibility. As discussed in the preceding, in certain circumstances a broader range of plasma species may be included in the plasma as a result of the improved control based on mass. Improving selectivity during an etching process may also allow thinner mask material and higher throughput. On some cases, the attainable selectivity may be so high as to enable fast quasi-atomic layer etching (QALE) without gas phase separation.

As the lighter ionic species diffuse, the average mass increases which also carries the advantage of narrowing the ion energy distribution (IED) peak. This may also advantageously increase process flexibility by allowing a more targeted energy range (i.e. imparted to the heavier ionic species using the delayed bias pulse).

Moreover, it may be that the radicals of the lighter species are also desirable to etch the target material. Since the radicals are charge neutral, the radicals of the lighter species may be less affected by the timing of an applied bias pulse. Therefore, the methods and apparatuses may also provide the advantage of allowing the radicals of the lighter species to reach the substrate along with the heavier ionic species while desirably excluding the lighter ionic species.

The ability to preferentially deliver heavier ionic species to the substrate at a given (desired, targeted, etc.) energy may advantageously allow improved control over the plasma process. For example, the placement and duration of the delayed bias pulse may be used as new "control knobs" for controlling the ratio at the substrate of an energetic heavier ionic species relative to one or more energetic light ionic species, the flux of the energetic heavier ionic species to the substrate, and the ratio at the substrate of the energetic heavier ionic species relative to one or more radical species (e.g. energetic ion flux to radical flux ratio).

The parameters of the delayed bias pulse are based on the diffusion time constants of a heavier ion and one or more lighter ions. The specific values of the delayed bias pulse parameters are determined according to the desired results for a given plasma process (e.g. desired energetic heavy ion flux, energetic light ion flux, dose of heavy ions, ion energy, etc.). The diffusion time constants of the ions in the plasma may primarily depend on the mass of the ions along with the geometry of the plasma processing chamber and the electron temperature of the plasma. These parameters may have the benefit of being stable and repeatable which may advantageously allow for a given optimized parameter set to be used for multiple substrates (e.g. wafers) and/or across multiple tools without needing re-optimization.

Embodiments provided below describe various methods, systems, and apparatuses for plasma processing, and in particular, to methods, systems, and apparatuses that include applying bias pulses to bombard a substrate with ions having a targeted mass. For example, in various embodiments, a delayed bias power pulse is applied to deliver an energetic ion flux of heavier ions after a delay based on diffusion time constants of ions in the plasma. The following description describes the embodiments. FIG. 1 is used to describe an example plasma process utilizing a delayed bias power pulse. Two more example plasma processes utilizing a delayed bias power pulse are described using FIGS. 2 and 3. Two example plasma processing apparatuses are described using FIGS. 4 and 5. An example method of plasma processing utilizing a bias power scan is described using FIG. 6 while FIG. 7 is used to describe an example process parameter metrology sequence. Two example plasma processing apparatuses that include metrology components are described using FIGS. 8 and 9. An example method of plasma processing utilizing time-resolved measurements within a pulse cycle is described using FIG. 10 while FIG. 11 is used to describe an example plasma processing apparatus. Four more example methods of plasma processing are then described using FIGS. 12-15.

FIG. 1 schematically illustrates an example plasma process utilizing a delayed bias power pulse to deliver an energetic ion flux having an increased flux of heavier ions relative to a flux of lighter ions in accordance with embodiments of the invention.

Referring to FIG. 1, a plasma process 100 is described using a schematic timing diagram 101 showing source power and bias power, a qualitative graph 102 showing the relative density of two ions within a plasma, and a qualitative graph 103 of the ratio of the two ion densities. The schematic timing diagram 101 includes an SP pulse 12 (source power pulse) with SP pulse width 113 and power $P_S$ followed by a BP pulse 14 (bias power pulse) with BP pulse width 115 and power $P_B$. The SP pulse 12 and the BP pulse 14 are separated by a delay 116. The SP pulse 12 followed by the BP pulse 14 may be repeated as part of a cyclic process with pulse period 117, for example. Optionally, there may be BP off-time 118 during which the bias power is off before the start of the next SP pulse 12.

The SP pulse 12 is used to generate a plasma (e.g. in a plasma processing chamber of a plasma processing apparatus). Although the plasma may include many additional species, for simplicity, only two species of the generated plasma will be discussed here: species A (e.g. a first species) and species B (e.g. a second species). Species A and species B (as well as their various plasma products such as ions and radicals) may have different properties, such as different reactivity towards materials of a substrate to be processed using the plasma (i.e. a target substrate).

While the source power is being applied (i.e. source power ON), a glow phase 22 of the plasma is maintained. During the glow phase 22, species A ions (A$^+$) with mass $M_{A+}$ and species B ions (B$^+$) with mass $M_{B+}>M_{A+}$ are generated causing both the ion density $n_{A+}$ and the ion density $n_{B+}$ to be high. There may be a difference between $n_{A+}$ and $n_{B+}$ during the glow phase 22 or the ion densities may be similar resulting in an ion density ratio $n_{B+}$:$n_{A+}$ (hereinafter labeled B:A for readability) that is about one.

However, it should be noted that these qualitative graphs depict the relative ion densities (i.e. normalized) and are not intended to show absolute ion densities. Therefore, an ion density ratio B:A that is greater than one indicates that the density of B$^+$ ions has increased relative to the density of A$^+$ ions. In other words, even if the maximum absolute A$^+$ ion density is 1,000 times that of the maximum absolute B$^+$ ion density in the glow phase 22, B:A is still defined to be one because the ion densities are normalized. Continuing this example, an ion density ratio B:A of ten indicates that the absolute A$^+$ ion density is now only 100 times that of the absolute B$^+$ ion density (an increase of B$^+$ ions relative to A$^+$ ions).

After the source power is removed (i.e. $P_S$=0, source power OFF), the plasma enters an afterglow phase 24 characterized by ion and electron cooling and recombination. During the beginning of the afterglow phase 24 (e.g. the early afterglow 125 of the afterglow phase 24) both ion densities $n_{A+}$ and $n_{B+}$ decrease rapidly. The more massive ions B$^+$ diffuse more slowly than the ions A$^+$, and their ion density ratio B:A increases, but not dramatically (as qualitatively illustrated). This may be because the densities are both still high in the early afterglow 125 and relatively little time has elapsed to allow the differing diffusion rates to affect the ion density ratio.

It should be mentioned that the graphs herein illustrated and described are schematic in nature and do not take into account certain effects, such as the influence of the bias power on the plasma (e.g., if its negligible, compared to the source power). However, if the source is off long enough, the discharge will eventually transition from high density plasma to low density capacitive discharge when bias power is on. This situation is not illustrated herein for simplicity, but may be present nonetheless.

After both ion densities $n_{A+}$ and $n_{B+}$ have decreased significantly in the early afterglow 125, the slower diffusion rate of the more massive ions B$^+$ results in a more pronounced difference between $n_{A+}$ and $n_{B+}$. This phase of the afterglow phase 24 may be loosely termed the late afterglow 126. As the afterglow phase 24 enters the late afterglow 126, the ion density $n_{A+}$ approaches zero while the ion density $n_{B+}$ is still much higher. Because $n_{A+}$ is decreasing at a faster rate than $n_{B+}$, the ion density ratio B:A quickly increases even while $n_{B+}$ continues to decrease.

The ions A$^+$ and B$^+$ may have different properties relative to a substrate to be processed using the plasma process 100. For example, the A$^+$ ions may be generally more reactive than the B$^+$ ions or may be more reactive than desired towards certain materials of the substrate. In particular, the A$^+$ ions may be more reactive than desired towards a mask material of the substrate (e.g. used to prevent etching/deposition processes from occurring at an underlying material). This could undesirably reduce selectivity because the energy imparted to the ions to etch a target material of the substrate may be high enough to allow the A$^+$ ions to etch the mask material. Put another way, the threshold ion energy of the A$^+$ ions to etch the mask material of the substrate may be lower than the threshold ion energy of the B$^+$ ions to etch the target material of the substrate. Then, when the B$^+$ ions are accelerated to the substrate with enough energy to etch the target material (i.e. using applied bias power), the A$^+$ ions are also accelerated with energy sufficient to etch the mask material and selectivity is reduced.

The delayed BP pulse 14 may be used to deliver energetic ions to a substrate as part of a deposition process, an etch process, or any other process utilizing the ions. In one embodiment, the delayed BP pulse 14 is used as part of a main etch of a target material. The selectivity of the main etch may be advantageously increased by preferentially delivering the B$^+$ ions to the substrate at a targeted energy. The main etch may be applied for a relatively long time resulting in a selectivity loss in cases where the A$^+$ ions are aggressive. Additionally, radicals A$^+$ of species A may be useful to etch the target material. In this case, the main etch would advantageously include energetic B$^+$ ions and A$^+$ radicals with a negligible flux of energetic A$^+$ ions.

The energetic B$^+$ ion flux may be lower than it would be if the bias power were applied earlier (due to the lower ion density), the ion angular distribution is narrow and the energetic A$^+$ ion flux is reduced or substantially zero. The narrow angular distribution may be advantageous for high aspect ratio etches (e.g. of the bottom of trenches or holes, such as for vias).

In various embodiments, the species A (first species) is a reactive species. In some embodiments, the species A comprises a halogen and is a halogen gas in one embodiment. For example, the species A may be chlorine (e.g. Cl, $Cl_2$). The species A may also be fluorine (e.g. F, $F_2$). The species A may also be an inert species. In one embodiment, the species A is helium (He). In various embodiments, the species B (second species) is an inert species. In some embodiments, the species B comprises a noble element and is Argon (Ar) in one embodiment. In another embodiment, the species B is Krypton (Kr). For example, the source gas of the plasma may be a $Cl_2$ and Kr gas mixture or a He and Ar gas mixture, and others.

One way to compare the diffusion rates of A$^+$ and B$^+$ is to compare their respective ion diffusion time constants, which measures the time it takes for the ion density to decrease by a certain amount (e.g. to $1/e \approx 37\%$ of its initial value in the case of exponential decay). For example, both the diffusion time constant $\tau_{A+}$ of A$^+$ and the diffusion time constant $\tau_{B+}$ of B$^+$ are shown in qualitative graph 102. Notably, $\tau_{A+}$ is shorter than $\tau_{B+}$ (i.e. because of the reduced mass) resulting in a much steeper decrease in the ion density $n_{A+}$ compared to the ion density $n_{B+}$ as already discussed.

It should be noted that ion diffusion time constants may not be the only mechanism by which the ion density drops. For example, other mechanism such as recombination may also play a role in decreasing the ion density over time. For this reason, a more general parameter may be ion lifetime in the plasma processing chamber. The methods and apparatuses described herein make reference to the ion diffusion time constants for simplicity, but ion lifetimes may also be used as a parameter of comparison. Further, it is understood that a consideration of ion lifetimes will include consideration of ion diffusion time constants. Therefore, determinations made according to ion lifetimes would also be made according to ion time diffusion constants.

During the glow phase 22, the ion densities are at a maximum. After the source power is removed, the afterglow phase 24 begins and there is a rapid decrease in the ion and electron temperatures, small changes in reactive neutral densities, and the ions diffuse toward the chamber walls. In general, for a plasma with one species of ions, the plasma diffusion time constant $\tau_D$ is related to the radius of the chamber R and the coefficient of ambipolar diffusion $D_A$. More specifically, for many systems, $\tau_D = R^2/D_A$.

However, the coefficient of ambipolar diffusion $D_A$ depends on the mass of the diffusing species. For low gas pressures, $\tau_D = R/vs$ where vs is the ion sound speed (i.e. the speed of ion acoustic waves through the plasma) that is approximately $(k_B T_e M_i)^{1/2}$ where $T_e$, is the electron temperature, $M_i$ is the ion mass, and $k_B$ is the Boltzmann constant. Importantly, the diffusion time constant r for each ion depends on variables that are either known or can be measured (directly or indirectly). As a result, appropriate values for the delay 116 and the BP pulse width 115 can be chosen to deliver the desired amount of heavier ions $B^+$ to a substrate in the desired ion density ratio B:A.

In one specific example, the source gas of the plasma may be a mixture of He (species A) and Ar (species B). The mass of helium $M_{He}$ is about $6.7 \times 10^{-27}$ kg while the mass $M_{Ar}$ is about $67 \times 10^{-27}$ kg. If we take the chamber pressure to be fairly low (e.g. 15 mTorr), the diameter of the chamber to be 30 cm (R=0.15 m), and the electron temperature $T_e$ to be about 4 eV, then $\tau_{He}$ is about 15.3 μs while $\tau_{Ar}$ is about 48.5 μs.

Similar calculations can be made to estimate the time diffusion constants for F ($M_F = 32 \times 10^{-27}$ kg), Cl ($M_{Cl} = 59 \times 10^{-27}$ kg), and Kr ($M_{Kr}$, $=139 \times 10^{-27}$ kg). For the above chamber conditions, the approximate diffusion time constants for these three elements are $\tau_F = 33.5$ μs, $\tau_{F2} = 47.4$ μs. $T_{Cl} = 45.5$ μs, $T_{Cl2} = 64.4$ μs, and $\tau_{Kr} = 69.9$ μs (where the presence of $F_2^+$ and $Cl_2^+$ ions has been acknowledged).

Based on these example time constants, the delay 116 may be as short as about 20 μs (for example if He is used and it is only desirable to decrease the He ion density to below about 25% of its maximum). While there is no upper limit to the length of the delay 116 (beyond $n_{B+}$ dropping too low to be useful or waiting too long to reignite the plasma), a longer delay 116 might be about 200 μs corresponding to a point at which only about 5% of the maximum Kr ion density remains in the chamber. Of course, changing the applied power to alter the electron temperature or changing the chamber size will change the diffusion time constants. Therefore, the specific value of the delay 116 will depend on the specifics of a given application.

Diatomic gases such as fluorine gas and chlorine gas are a simple example of a plasma that may have more than just two ionic species. It should be noted that although the explanations herein are simplified by using two species A and B, all of the examples apply to more complex systems including more than two species. The decision of when to apply a bias pulse may then be based on the time diffusion constants of all of the relevant ions and may involve applying power when a certain average ion mass is achieved or when a sufficient number of light ions of particular relevance have diffused.

For systems in which there are two relevant ions (at least to a reasonable approximation) with different masses and the heavier ion is more desirable for a specific purpose than the lighter ion, the ion density ratio B:A may be a particularly useful metric. For example, B:A may be very useful in cases where a desirable heavy ion is identified and an undesirable (maybe overly aggressive) light ion is identified because the optimal location of the delayed BP pulse may be calculated with greater specificity. The ion density ratio B:A may be selected to be a predetermined value when the delayed BP pulse is applied (and for the duration of the BP pulse). In some embodiments, B:A is greater than one when the delayed BP pulse is applied relative to a normalized ion density ratio at the end of an applied SP pulse. In other embodiments, the ratio is higher. For example, B:A may be greater than about two, greater than about five, or higher when the delayed BP pulse is applied. Various considerations may play a role in deciding when to apply the delayed BP pulse, many of which are discussed herein, but may depend on the specifics of a given application.

Some systems may have one heavier ion $B^+$ of interest that is desirable at the substrate and a variety of lighter ions that are not desirable (or less desirable). For example, a desirable heavy ion may be known while all lighter ions below a certain mass lead to decreased selectivity or not enough is known about what is decreasing selectivity beyond that the heavy ion is highly selective. The ion energy distribution may also narrow as the average ion mass increases, which may also be desirable to improve processing outcomes. In these cases, other metrics can be used such as the ratio between the heavier ion and all lighter ions or the average ion mass. Average ion mass is not as specific as the ion density ratio B:A, but may still correlate with increasing desirable metrics such as selectivity.

There is no requirement that the delayed BP pulse be applied at any particular lighter ion density $n_{A+}$. That is, although preferential bombardment by the heavier ion $B^+$ at a targeted energy may be desirable, the concurrent acceptable (or desirable) flux of $A^+$ ions at this energy may depend on the details of the specific application. In some embodiments, the ion density $n_{A+}$ is less than about 10% of the maximum $A^+$ ion density (i.e. during the SP pulse) when the delayed BP pulse is applied. In another embodiment, the ion density $n_{A+}$ is less than about 5% of the maximum $A^+$ ion density when the delayed BP pulse is applied. The low ion density may result in little or no energetic $A^+$ ion flux. For example, the energetic $A^+$ ion flux may be substantially zero in one embodiment.

The range of acceptable values for $n_{B+}$ when the delayed BP pulse is applied may therefore be large, such as between 100% and 1% of the maximum $B^+$ ion density (i.e. during the SP pulse). However, the optimal value of the ion density $n_{B+}$ for a given application may depend on a number of factors. For instance, there may be a tradeoff between delaying long enough to allow the ion density $n_{A+}$ to drop to a low enough level and applying the BP pulse soon enough to achieve the desired energetic $B^+$ ion flux (i.e. $n_{B+}$ is not too low). Additionally, the total number $B^+$ ions delivered to the substrate during the BP pulse width 115 (e.g. the $B^+$ ion dose) may be considered. If a certain dose is desired, the duration of the delay 116 may be limited by the pulse period 117.

One specific example method utilizing the plasma process 100 includes generating plasma by coupling the corresponding SP pulse 12 to a plasma processing chamber containing a substrate holder configured to support a substrate. The plasma is contained in the plasma processing chamber and includes first ions $A^+$ having a first mass $M_{A+}$ and second ions $B^+$ having a second mass $M_{B+}$ greater than the first mass $M_{A+}$. During the source power pulse (e.g. at the end of the pulse) the generated plasma the ion density ratio of the second ions $B^+$ to the first ions $A^+$ is a first ratio. The method of this specific example further includes delivering an energetic ion flux of second ions $B^+$ to the substrate by applying a delayed BP pulse 14 to the substrate holder after a delay (e.g. the delay 116) between the corresponding SP pulse 12 and the delayed BP pulse 14, the delay being chosen based on the diffusion time constant $\tau_{A+}$ of the first ions $A^+$ and the diffusion time constant $\tau_{B+}$ of the second ions B$^+$ so that the ratio of the second ions B$^+$ to the first ions A$^+$ is a second ratio greater than the first ratio. That is, the flux of energetic second ions B$^+$ relative to the flux of energetic first ions A$^+$ is increased compared to if a BP pulse were applied earlier.

Figure 2:
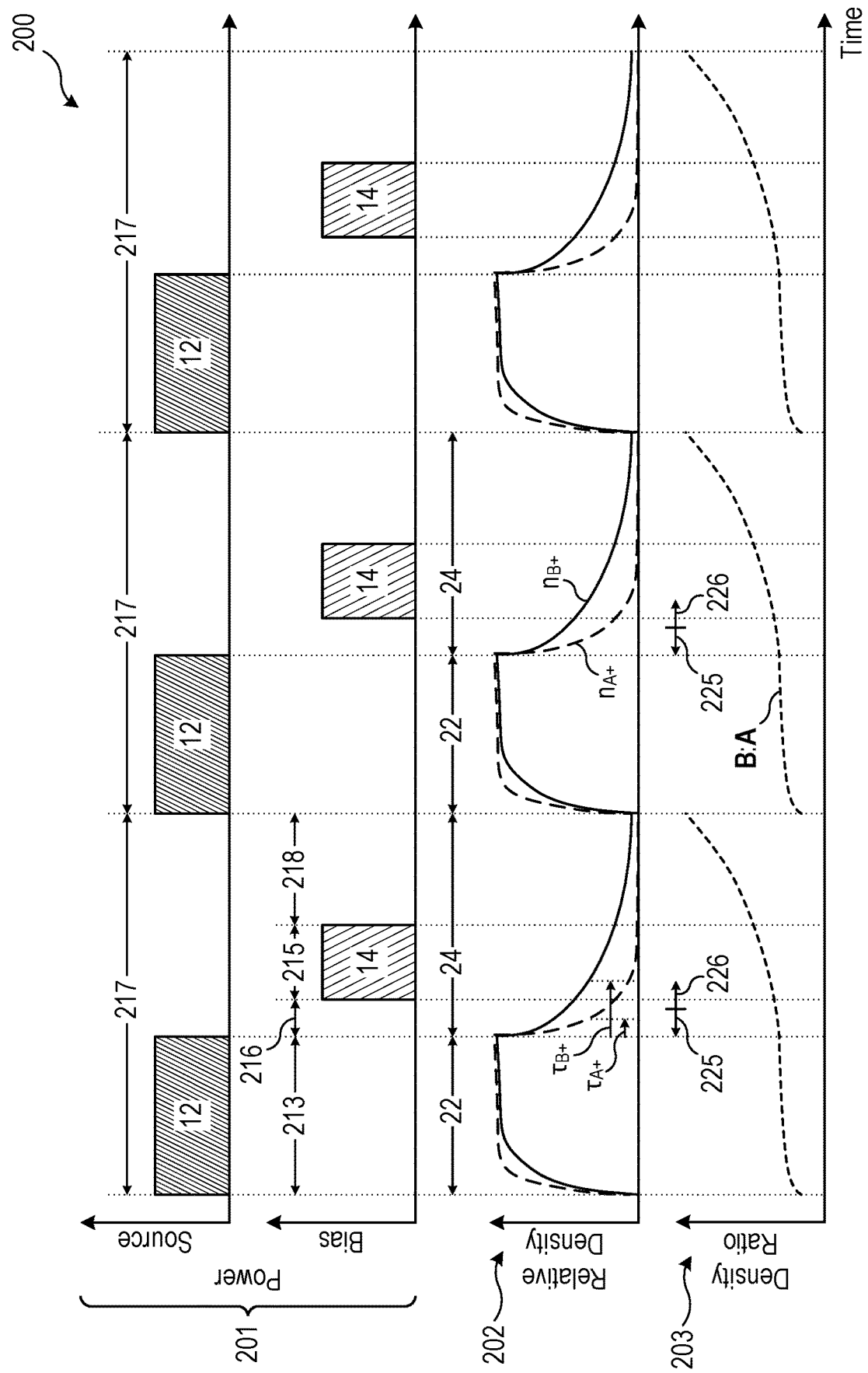
FIG. 2 schematically illustrates an example plasma process utilizing delayed bias power pulses as part of a cyclic process in accordance with embodiments of the invention.

FIG. 2 schematically illustrates an example plasma process utilizing delayed bias power pulses as part of a cyclic process in accordance with embodiments of the invention. The plasma process of FIG. 2 may be a specific implementation of other plasma processes described herein such as the plasma process of FIG. 1, for example. Similarly labeled elements may be as previously described.

Referring to FIG. 2, a plasma process 200 is described using a schematic timing diagram 201, a qualitative graph 202, and a qualitative graph 203. It should be noted that here and in the following a convention has been adopted for brevity and clarity wherein elements adhering to the pattern [×01] may be related implementations of a schematic timing diagram in various embodiments. For example, the schematic timing diagram 201 may be similar to the schematic timing diagram 101 except as otherwise stated. An analogous convention has also been adopted for other elements as made clear by the use of similar terms in conjunction with the aforementioned numbering system.

The plasma process 200 is a specific implementation of the plasma process 100 that is cyclically repeated during a pulse period 217 (e.g. a cycle). More specifically, the plasma process 200 cyclically repeats generating a plasma using source power and delivering a flux of energetic B$^+$ ions using bias power applied as a delayed BP pulse 14. As shown, the SP pulse 12 is applied with an SP pulse width 213 followed by a delay 216 and then the BP pulse 14 with a BP pulse width 215.

The timescale of the pulse period 217 may depend on several factors including the metric targeted for control. For example, pulsing that targets control of the IED of ion angular distribution (IAD) may be at a millisecond timescale (100s of Hz). In contrast, pulsing that targets control of ion mass (e.g. preferential bombardment of heavier ions) may be at the microsecond timescale such as 10 s of µs (1 kHz to 10 s of kHz). In various embodiments, the pulse frequency of the SP pulse 12 ranges from about 100 Hz to about 50 kHz. In other embodiments, the pulse frequency of the SP pulse 12 ranges from about 1 kHz to about 20 kHz.

Some pulse parameters of the present example are different from the previous example to demonstrate other possible configurations. For example, the BP pulse 14 is applied earlier in the afterglow phase 24 than in the previous example and is not applied for the full pulse period 217 resulting in a longer BP off-time 218. Also, in contrast to the previous example, the BP pulse 14 is applied earlier than the diffusion time constant $\tau_{B+}$. This may be advantageous in situations where a higher flux of energetic B$^+$ ions is desired and some flux of energetic A$^+$ ions is manageable (e.g. the negative effects of the A$^+$ ions is minor or are outweighed by the positive effects of more B$^+$ ions).

It should be noted that the definition of the early afterglow and the late afterglow are intended to be conceptually useful and not intended to be concretely defined time periods within the afterglow phase. For example, the concept of the early afterglow is useful most cases where preferential bombardment of heavy ions is desirable because the early portion of the afterglow phase represents a time where an undesirably high density of light ions is still present. Similarly, the late afterglow concept is also useful because at some point the differences in diffusion time constants due to differences in mass result in a desirably low density of light ions.

However, the optimal delay 216 and BP pulse width 215 may vary based on any number of factors specific to a given plasma process such as the type of process, substrate materials (e.g. mask and target), type of ions, gas flowrates, chamber pressure, and many others. To illustrate this point, the line dividing the early afterglow 225 and the late afterglow 226 are shown as being closer to the SP pulse 12 than in the previous example.

Figure 3:
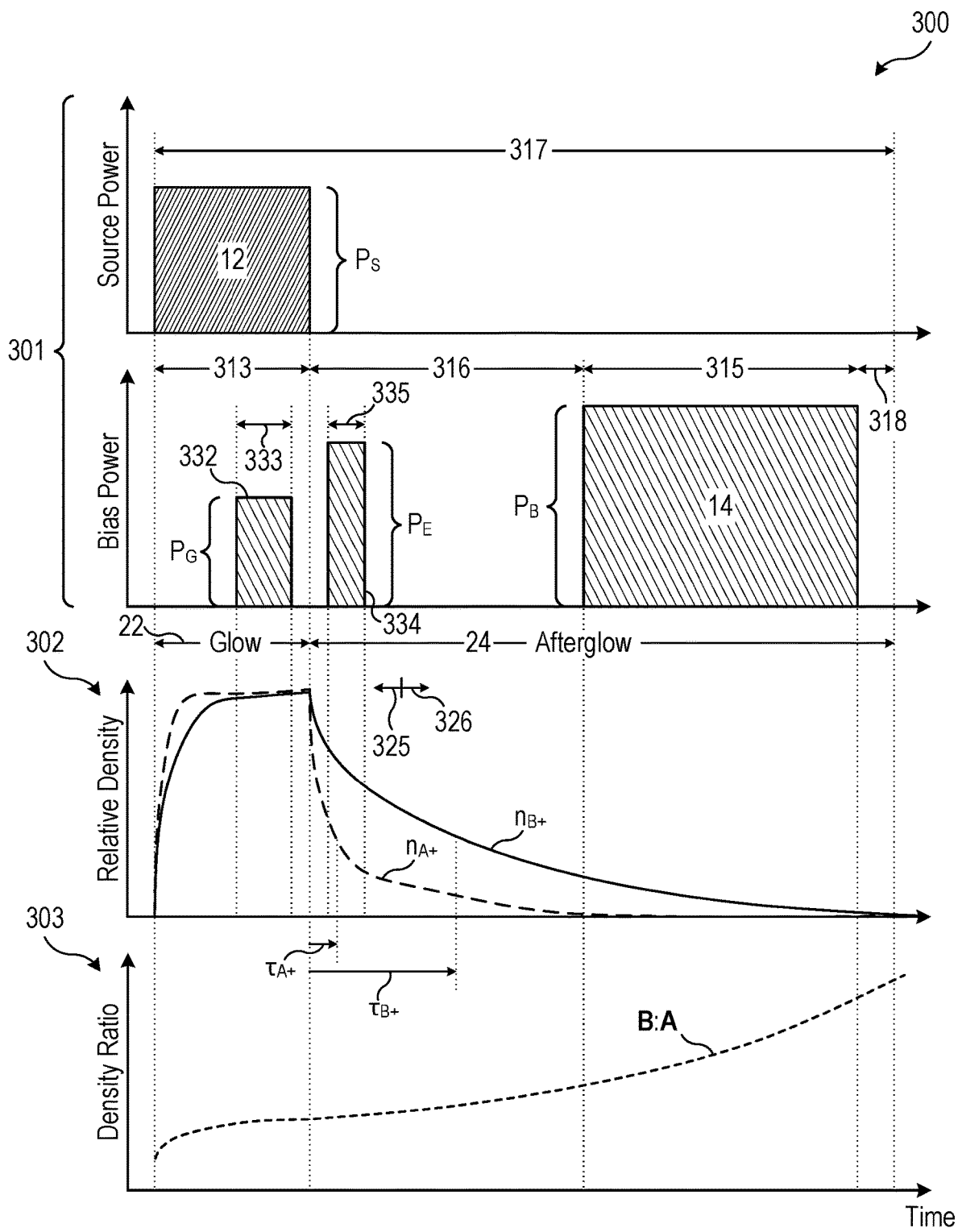
FIG. 3 schematically illustrates an example plasma process utilizing one or more additional bias power pulses in addition to a delayed bias power pulse in accordance with embodiments of the invention.

FIG. 3 schematically illustrates an example plasma process utilizing one or more additional bias power pulses in addition to a delayed bias power pulse in accordance with embodiments of the invention. The plasma process of FIG. 3 may be a specific implementation of other plasma processes described herein such as the plasma process of FIG. 1, for example. Similarly labeled elements may be as previously described.

Referring to FIG. 3, a plasma process 300 is described using a schematic timing diagram 301, a qualitative graph 302, and a qualitative graph 303 as before. The plasma process 300 is a specific implementation of the plasma process 100 where additional BP pulses are included along with the BP pulse 14, which is again separated from the SP pulse 12 by a delay 316. The SP pulse 12 and the BP pulse 14 may again be repeated as part of a cyclic process with pulse period 317 with an optional BP off-time 318 during which the bias power is off before the start of the next SP pulse 12.

During the glow phase 22, the SP pulse 12 is applied with SP pulse width 313 and power P$_S$. In contrast to previous examples, an additional BP pulse may be applied during the glow phase 22 to deliver a large flux (e.g. because ion densities are high) of energetic ions to the substrate that includes both A$^+$ ions and B$^+$ ions. Specifically, a BP$_G$ pulse 332 (i.e. a glow phase bias power pulse) may optionally be applied during the SP pulse 12 with BP$_G$ pulse width 333 at a power PG (or voltage VG in the case of DC bias). Since the SP pulse 12 is being applied concurrently with the BP$_G$ pulse 332, a glow phase energetic ion flux of A+ and B$^+$ ions is delivered while generating the plasma by applying the BP$_G$ pulse 332 (e.g. to a substrate holder supporting a substrate).

Because the ion temperature is so high during the glow phase 22, the large flux of ions produced by the BP$_G$ pulse 332 may have less verticality when compared to ions delivered to the substrate in the afterglow phase 24. The BP$_G$ pulse 332 may be particularly useful when ion directionality is less important than high ion flux and high ion energies. It may be desirable to provide as many ions as possible in a short amount of time. The very high ionic density during the SP pulse 12 may be beneficial for removing residue using both types of ions. For instance, the BP$_G$ pulse 332 may be used to remove mask residue during an etching process using both A$^+$ and B$^+$ ions. Since the mask residue is at the top of the features, the lack of directionality may be less important. Further, surfaces of the mask are being targeted by the ions so selectivity may also be less important.

Another type of additional BP pulse may be applied during the early afterglow 325 of the afterglow phase 24 to deliver energetic (e.g. directional) ions to the substrate that includes both A$^+$ ions and B$^+$ ions. Specifically, a BP$_E$ pulse 334 (i.e. an early afterglow bias power pulse) may optionally be applied with BP$_E$ pulse width 335 and power P$_E$ (or voltage V$_E$ in the case of DC bias) after the SP pulse 12 and before the BP pulse 14. Put another way, after generating the plasma using the SP pulse 12 and before delivering the energetic ion flux of B⁺ ions using the BP pulse 14, an early afterglow energetic ion flux of A⁺ and B⁺ ions is delivered to the substrate by applying the BPE pulse 334 (e.g. to a substrate holder supporting the substrate).

Since the plasma is now in the afterglow phase 24, the ion densities $n_{A+}$ and $n_{B+}$ are lower than in the glow phase 22, but they are still much higher than in the late afterglow 326. Consequently, as previously discussed, it may be impractical preferentially bombard the substrate with the heavier ions B⁺ using a bias pulse during the early afterglow 325. However, there may be situations where selectivity is less important and the improved directionality (i.e. narrower angular distribution) due to reduced ion temperature is beneficial.

One such situation might be to clean the bottom of features in between etching steps. For example, material may be much more difficult to remove in the corners at the bottom of features (e.g. holes, trenches), especially in high aspect ratio etches. As previously discussed, the A⁺ ions may be much more aggressive than the B⁺ ions. Therefore, delivering a highly directional (e.g. highly energetic) ion flux capable of reaching the bottom of features that includes aggressive A⁺ ions may be advantageous. It should be noted that if the A⁺ are more aggressive (e.g. etch the mask) then the $BP_E$ pulse 334 may be kept relatively short to avoid mask erosion.

Although exceptions certainly exist for some applications, there are some general observations that are worth noting regarding the relationship between the parameters of the BP pulse 14, the $BP_G$ pulse 332, and the $BP_E$ pulse 334. For example, it has already been discussed at length that preferential bombardment of the heavier B⁺ ions is desirable for the plasma process 300. As a result, the widths of the BP pulses that deliver desired numbers of energetic lighter A⁺ ions ($BP_G$ pulse width 333 and $BP_E$ pulse width 335) are typically shorter (e.g. much shorter) than the BP pulse width 315.

Another example is the power level (or voltage level as the case may be) of the BP pulses. Since the $BP_G$ pulse 332 occurs during the glow phase 22 when ion densities $n_{A+}$ and $n_{B+}$ are at their peak and aggressive A⁺ ions are delivered to the substrate, the power PG will typically be lower (e.g. much lower) than the power $P_B$. Similarly, the ion densities $n_{A+}$ and $n_{B+}$ drop off rapidly in the early afterglow 325 of the afterglow phase 24 making increased power more desirable so the power $P_E$ is generally higher than PG. Additionally, more power may be needed to impart the desired verticality to the ions during the $BP_G$ pulse 332. Yet, the ion densities are still higher than in the late afterglow 326 and aggressive A⁺ ions are included in the energetic ion flux. Therefore, the power $P_E$ may still be lower than $P_B$.

Similar to the BP pulse 14, the exact location of the $BP_G$ pulse 332 and the $BP_E$ pulse 334 may be determined based on the specific parameters of a given application. A general guideline for the $BP_G$ pulse 332 might be to locate it closer to the end of the glow phase 22 because (as illustrated) the ion densities $n_{A+}$ and $n_{B+}$ are more similar and stable. A similar guideline for the $BP_E$ pulse 334 might be to locate it closer to the beginning of the early afterglow 325 (e.g. even before the diffusion time constant $\tau_{A+}$) so that more A⁺ ions can be delivered in a shorter amount of time. However, in order to achieve improved verticality, some delay between the SP pulse 12 and the $BP_E$ pulse 334 is likely beneficial.

Figure 4:
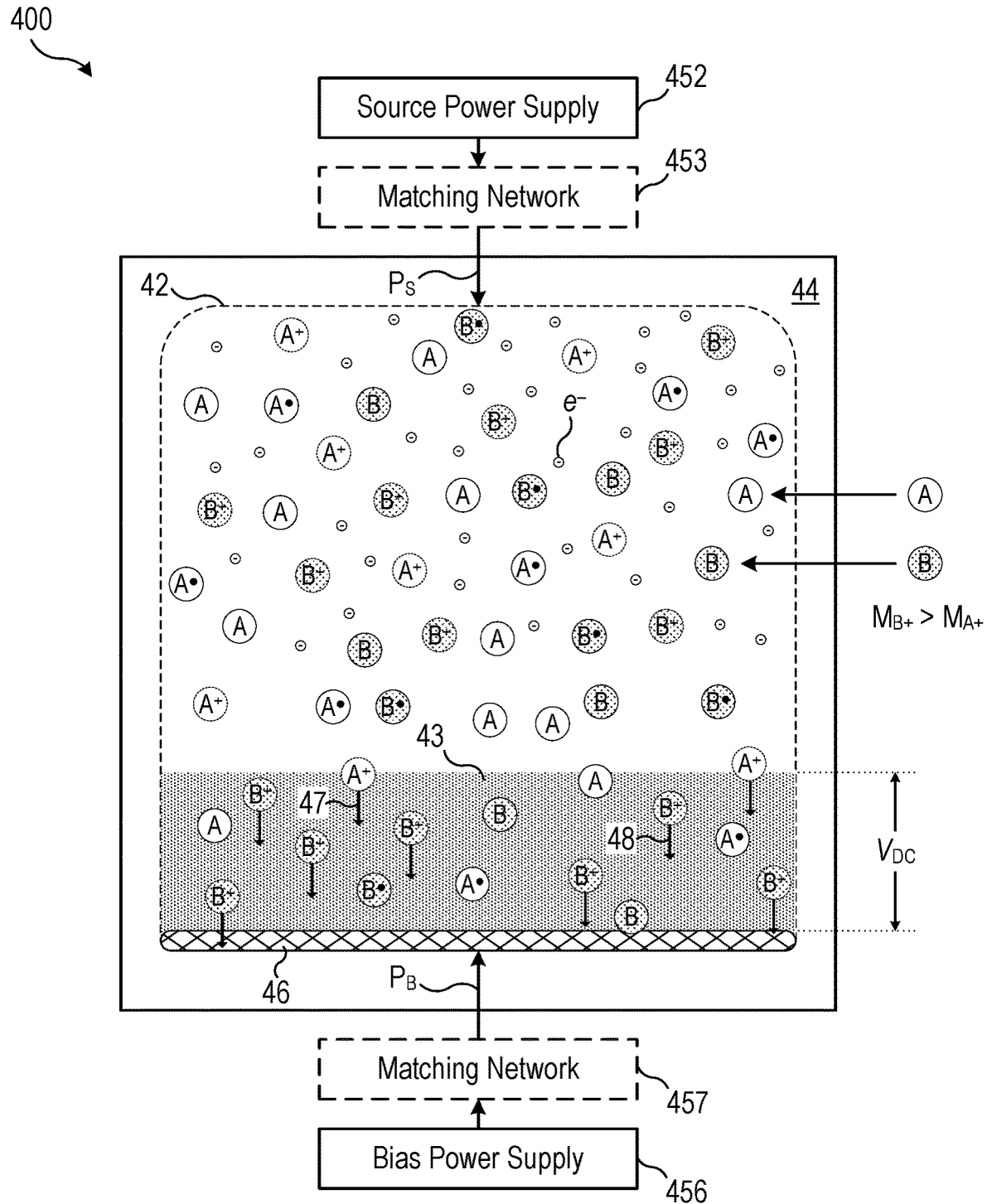
FIG. 4 illustrates a schematic diagram of an example plasma processing apparatus that may be used to deliver an energetic ion flux having an increased ion density ratio of heavier ions relative to lighter ions in accordance with embodiments of the invention.

FIG. 4 illustrates a schematic diagram of an example plasma processing apparatus that may be used to deliver an energetic ion flux having an increased ion density ratio of heavier ions relative to lighter ions in accordance with embodiments of the invention. The plasma processing apparatus of FIG. 4 may be used to perform any of the plasma processes described herein, such as the plasma process of FIG. 1, for example. Similarly labeled elements may be as previously described.

Referring to FIG. 4, a plasma processing apparatus 400 is configured to include a plasma 42 contained within a plasma processing chamber 44. The plasma 42 is generated using a source power supply 452 coupled to the plasma processing chamber 44 (e.g. using a coupling element such as an electrode or an inductive coil) and configured to deliver source power $P_S$ to the plasma 42. Specifically, the source power supply 452 is configured to couple SP pulses to the plasma processing chamber 44 to generate the plasma 42. An optional source impedance matching network 453 may be included between the source power supply 452 and the plasma processing chamber 44 (e.g. for RF source power). Alternatively, even for RF source power, the optional source impedance matching network 453 may be omitted, such as in cases where a resonant source power coupling element is used.

As described in the foregoing, the plasma 42 includes at least two ionic species, species A⁺ and species B⁺, and the mass of B⁺ is greater than the mass of A⁺ ($M_{B+} > M_{A+}$). Ions A⁺ and B⁺ may also have different reactivities. That is, ions A⁺ and B⁺ differ chemically and therefore may have different reactivities toward various materials such as mask materials and/or target materials. Additionally, the plasma 42 may also include radicals A⁺ and radicals B⁺ as well as electrons e⁻, negative ions, multiply charged ions, additional dissociation products, additional precursors, additional carrier (e.g. inert, buffer) gases, additives, and others (not shown). The ions A⁺ and B⁺ are positively charged (although of course negative ions are also possible and may be present) while the radicals A⁺ and B⁺ have no net electric charge.

A substrate 46 included within the plasma processing chamber 44 may be the target of a plasma process performed using the plasma processing apparatus 400. A bias power supply 456 is configured to couple bias power $P_B$ to the substrate 46 to create a potential difference (e.g. self-bias or DC bias) between the substrate 46 and the plasma 42 and form a plasma sheath 43 with sheath voltage $V_{DC}$. Specifically, the bias power supply 456 is configured to apply a BP pulse to the substrate 46 after a delay to deliver an energetic ion flux of ions comprising a heavier ionic species (e.g. B⁺) to the substrate 46. As with the source power, an optional bias impedance matching network 457 may also be included between the substrate 46 and the bias power supply 456.

The plasma sheath 43 created by the biased substrate 46 (in this case negatively biased) accelerates ionic species of the plasma 42 under the same potential difference ($V_{DC}$) creating a flux of energetic A⁺ ions 47 and a flux of energetic B⁺ ions 48 at the substrate 46. The magnitude of the ion fluxes (ignoring the ion energy) depends in large part on the density of the ions and may be substantially unaffected by the applied bias power. However, the bias power imparts energy to the ions at the time the bias is applied increasing the flux of energetic ions (i.e. the energetic ion flux).

As previously discussed, if the bias power $P_B$ is applied in the later portion of the afterglow phase of the plasma 42, the density of B⁺ ions $n_{B+}$ will be greater than the density of A⁺ ions $n_{A+}$ and the flux of energetic B⁺ ions 48 will be greater than the flux of energetic A⁺ ions 47. Indeed, the flux of energetic A⁺ ions 47 may be desirably negligible or even substantially zero resulting in the preferential bombardment of the substrate by the heavier B⁺ ions.

The plasma 42 may be an RF plasma or any other suitable type of plasma. For example, the plasma 42 may be a capacitively coupled plasma (CCP), an inductively coupled plasma (ICP), a surface wave plasma (SWP), electron cyclotron resonance (ECR) plasma, helical resonator (HR) plasma, and others. The details of how the source power is coupled to the plasma 42 may depend on the specific plasma process. In one embodiment, the plasma 42 is a CCP plasma and the source power is coupled using an upper electrode (e.g. planar electrode). In other embodiments, the plasma 42 is an ICP plasma and the source power is inductively coupled through a dielectric material using a coil or an antenna.

Figure 5:
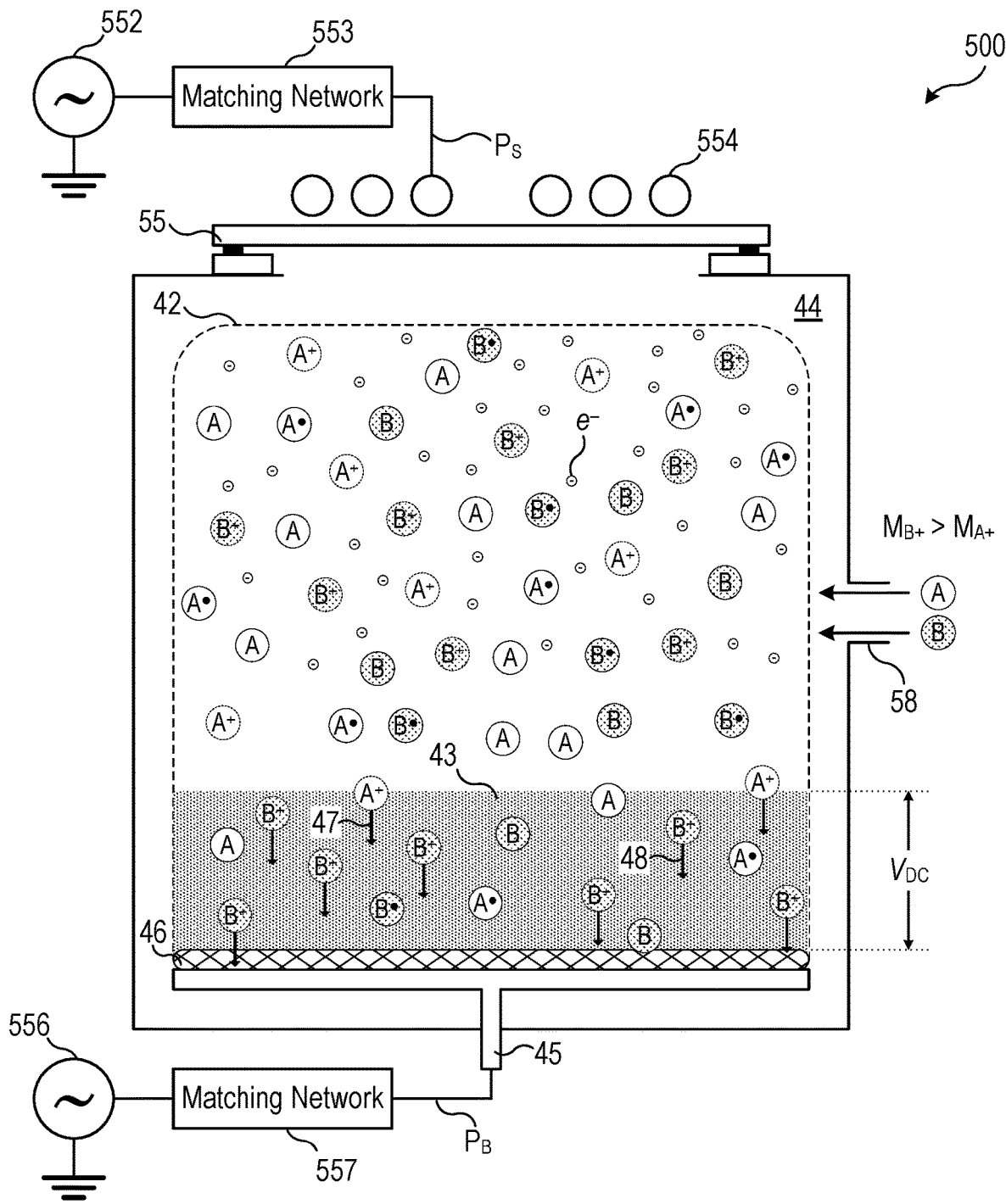
FIG. 5 illustrates a schematic diagram of an example plasma processing apparatus that includes radio frequency source power inductively coupled to a plasma and radio frequency bias power coupled to a substrate holder in accordance with embodiments of the invention.

FIG. 5 illustrates a schematic diagram of an example plasma processing apparatus that includes radio frequency source power inductively coupled to a plasma and radio frequency bias power coupled to a substrate holder in accordance with embodiments of the invention. The plasma processing apparatus of FIG. 5 may be a specific implementation of other plasma processing apparatuses described herein, such as the plasma processing apparatus of FIG. 4, for example, and may be used to perform any of the plasma processes described herein, such as the plasma process of FIG. 1. Similarly labeled elements may be as previously described.

Referring to FIG. 5, a plasma processing apparatus 500 also includes a plasma 42 contained within a plasma processing chamber 44. The plasma processing apparatus 500 is a specific implementation of the plasma processing apparatus 400 that couples an RF SP supply 552 (radio frequency source power supply) to a plasma processing chamber 44 through a dielectric 55 using an inductive SP coupling element 554 (e.g. a coil as shown). A source impedance matching network 553 is included between the RF SP supply 552 and the inductive SP coupling element 554.

The substrate 46 is supported by a substrate holder 45 that is coupled to an RF BP supply 556 (radio frequency bias power supply) through a bias impedance matching network 557. The substrate holder 45 is disposed within the plasma processing chamber 44, as illustrated. For example, the substrate holder 45 may be an electrostatic chuck (ESC) or any other suitable support structure.

Gases including species A and species B may be flowed into the plasma processing chamber 44 through a gas inlet 58. In one embodiment, the gas inlet 58 (or inlets) are through a sidewall of the plasma processing chamber 44. Alternatively or additionally, gas may be flowed into the plasma processing chamber 44 through the top of the plasma processing chamber 44, such as using a shower head configuration. The chamber pressure is controlled (typically under vacuum conditions) using one or more vacuum pumps (not shown).

Figure 6:
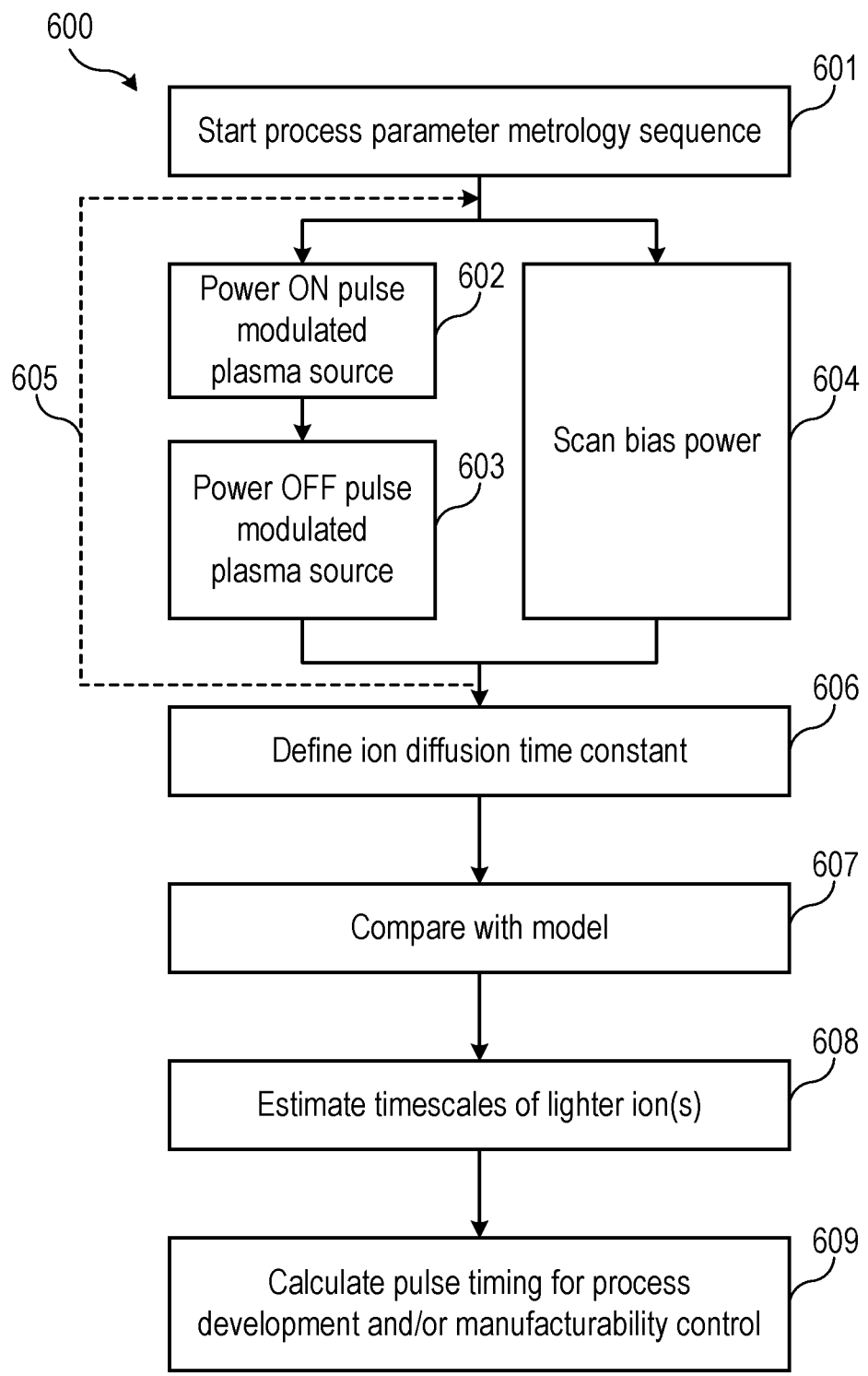
FIG. 6 illustrates an example method of plasma processing utilizing a bias power scan that may be used to calculate ion diffusion time constants used to determine plasma process parameters for delayed bias pulses in accordance with embodiments of the invention.
Figure 7:
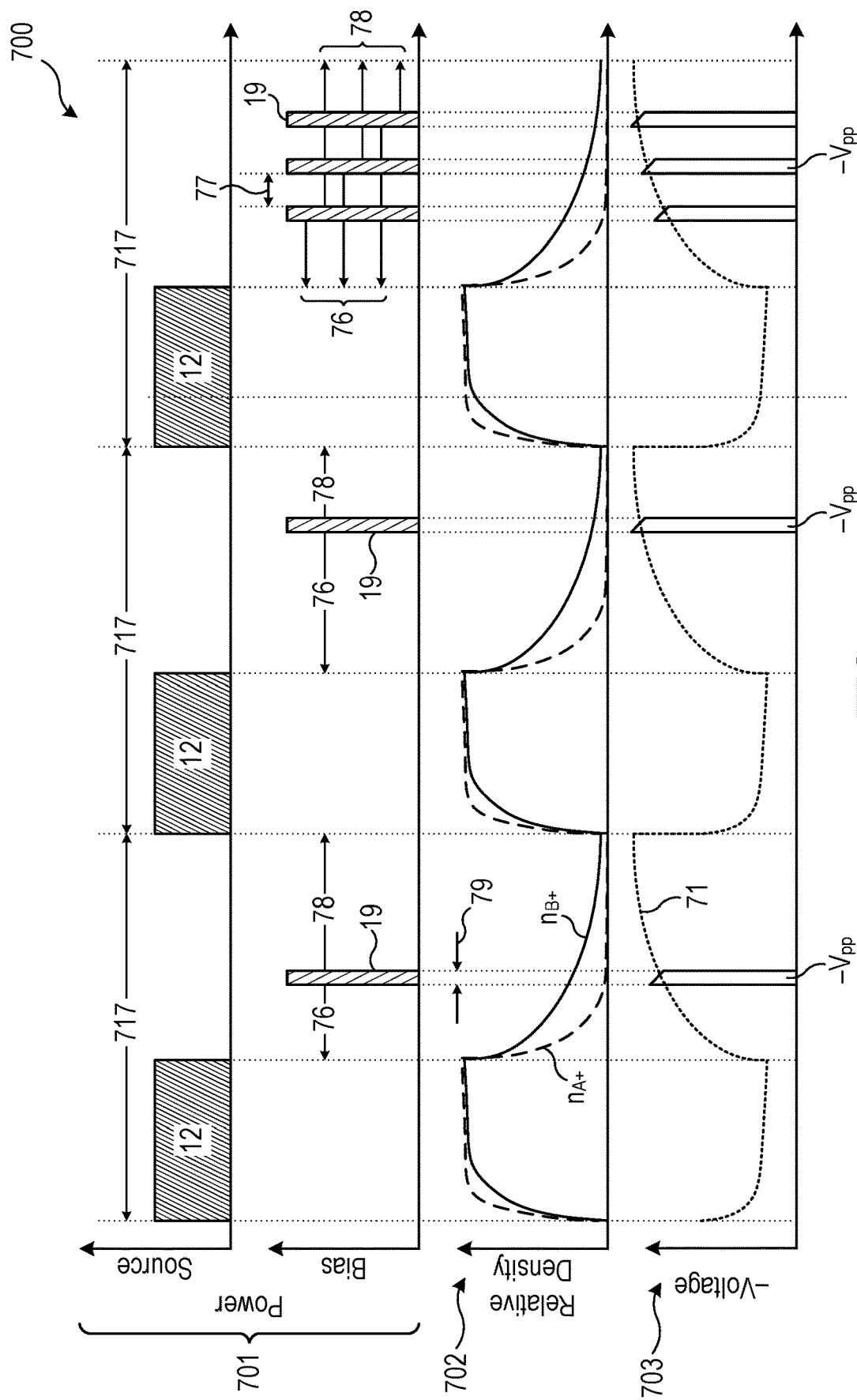
FIG. 7 schematically illustrates an example process parameter metrology sequence utilizing bias power test pulses to measure a voltage response indicative of ion density in a plasma for use in calculating ion diffusion time constants in accordance with embodiments of the invention.

FIG. 6 illustrates an example method of plasma processing utilizing a bias power scan that may be used to calculate ion diffusion time constants used to determine plasma process parameters for delayed bias pulses in accordance with embodiments of the invention. The method of FIG. 6 may be combined with other methods and performed using the systems and apparatuses as described herein. For example, the method of FIG. 6 may be combined with various aspects of any embodiments described using FIGS. 1-5 and 7-15. Although shown in a logical order, the arrangement and numbering of the steps of FIG. 6 are not intended to be limited. The method steps of FIG. 6 may be performed in any suitable order or concurrently with one another as may be apparent to a person of skill in the art.

Referring to FIG. 6, a method 600 may be used to define actual diffusion time constants that may in turn be used to locate delayed bias pulses within the afterglow phase of a plasma in order to deliver the desired flux of heavy ions $B^+$ at a targeted energy and with the desired ion density ratio B:A (i.e. with low or negligible levels of light ions $A^+$). For example, as discussed in more detail above, the delay between an SP pulse and a delayed BP pulse that will result in desired degree of preferential bombardment of heavy ions $B^+$ is based on the diffusion time constants of the ions $B^+$ ($\tau_{B+}$) relative to lighter ions, such as ions A ($\tau_{A+}$).

Even in situations where accurate theoretical models are available to calculate the diffusion time constants, real systems may deviate from theory for a variety of reasons. Furthermore, plasma processing systems are often sufficiently complicated so as to make simplified theoretical modeling difficult or impractical. Therefore, it may be advantageous to use measurements from the actual plasma processing system or a similarly configured system in conjunction with theoretical models to more accurately calculate the diffusion time constants.

The method 600 begins at a first step 601 of starting a process parameter metrology sequence. This may include automated or manual data collection under conditions identical or functionally similar to conditions of a plasma process for which diffusion time constants are being determined. The process parameter metrology sequence may be an internal metrology process (e.g. performed in situ in the plasma processing apparatus as part of the plasma process or immediately before the plasma process is performed). The process parameter metrology sequence may also be an external metrology process (e.g. performed temporally or spatially separate from the plasma process and/or the plasma processing apparatus).

The process parameter metrology sequence may be performed by a metrology component coupled to a plasma processing chamber containing a plasma that is being analyzed. This metrology component may be integrated into a plasma processing apparatus or may be included as part of a diagnostic system that simulates aspects of a processing environment of a plasma process. A controller coupled to the metrology component may control on or more of data collection (e.g. measurements), data processing, data analysis, pulse timing, and process execution during the process parameter metrology sequence and during the plasma process.

As shown in this specific example, a pulse modulated plasma source (e.g. a source power supply) is turned on (power ON state) in step 602. This generates a glow phase of a plasma that includes the ions of interest. The plasma source is then turned off (power OFF state) in step 603 initiating an afterglow phase of the plasma. For example, steps 602 and 603 may be one cycle of pulsed source power generating the plasma. During step 602 and/or step 603, bias power is applied in step 604 (e.g. as BP pulses) in order to probe ion densities in the afterglow phase. That is, a scan of at least a portion of the afterglow phase of the plasma is performed using bias power. The bias power scan may also include at least a portion of the glow phase.

The bias power may be applied during step 604 as a selected amplitude. The amplitude may be constant over the bias power scan or may be dynamic (e.g. ramping). Time resolved measurements are obtained using the known time and amplitude at each measurement during the scan.

In cases where not all of the desired portion of the afterglow phase can be scanned during a single afterglow phase, steps 602, 603, and 604 may be repeated in an optional step 605 as a cyclic process for any number of times to acquire measurements. For example, different regions of the afterglow phase may be measured in subsequent cycles to complete the data set. Alternatively or additionally, repeated measurements of the same region of the afterglow phase may be used to increase accuracy through averaging, for example.

The measurements obtained during the bias power scan are used to define (e.g. calculate, estimate, etc.) the ion diffusion time constant (e.g. for the average ionic mass) which can be used, for example, to estimate the diffusion time constant $\tau_{B+}$ of the heavier ion $B^+$ in step 606. In various embodiments, the measurements used to define $\tau_{B+}$ include data from the late afterglow portion of the afterglow phase. This may advantageously allow many or all of the lighter ions in the plasma to dissipate resulting in measurements that are predominantly related to $B^+$.

Once the diffusion time constant $\tau_{B+}$ is defined, a comparison can be made (step 607) between a theoretical model of the plasma system and the actual plasma system using $\tau_{B+}$ (as well as other measured and known parameters). Various experimental variables may then be adjusted to fit the theoretical model to the actual plasma system.

Once the model has been adjusted, the timescales (e.g. including or related to diffusion time constants) of other, lighter ionic species such as $\tau_{A+}$ can be estimated from measurements taken during the bias power scan in step 608. These measurements can include data from any part of the afterglow phase, but including data from the early afterglow portion may advantageously provide additional information about lighter ions.

Using the ionic diffusion time constants along with any other information derived from the process parameter metrology sequence, pulse timing can be calculated for process development and/or manufacturability control in step 609. In particular, a delay between SP pulses and delayed BP pulses that preferentially delivers $B^+$ ions (the heavier ions) to a substrate can be obtained by determining the ion diffusion time constants ($n_{A+}$ and $n_{B+}$), comparing the measurements to diffusion time constants predicted by the ion masses ($M_{A+}$ and $M_{B+}$), and selecting a delay that is greater than the diffusion time constant $n_{A+}$ so that the flux of energetic ions to the substrate has a ratio of the $B^+$ ions to $A^+$ ions that is greater than one relative to a normalized ion density ratio at the end of an applied SP pulse (i.e. because the ion density ratio B:A is greater than one during the application of the delayed BP pulses).

Based on the equations discussed in the foregoing, each of the ion diffusion time constants may be predicted by dividing the radius of the plasma processing chamber by the square root of the electron temperature of the plasma and then multiplying by the square root of the ion mass. However, as discussed above, other relationships may also be used depending on the specific assumptions that are relevant for a given plasma processing apparatus and/or plasma process and the desired level of accuracy.

FIG. 7 schematically illustrates an example process parameter metrology sequence utilizing bias power test pulses to measure a voltage response indicative of ion density in a plasma for use in calculating ion diffusion time constants in accordance with embodiments of the invention. The process parameter metrology sequence of FIG. 7 may be used during methods described herein, such as the method of FIG. 6, for example. Similarly labeled elements may be as previously described.

Referring to FIG. 7, a process parameter metrology sequence 700 is described using a schematic timing diagram 701, a qualitative graph 702 showing relative ionic density, and a qualitative graph 703 showing voltage response. Specifically, the pulse timing shown in the schematic timing diagram 701 may be a specific implementation of steps 602-605, for example.

During the process parameter metrology sequence 700, a SP pulse 12 is applied followed by at least one BP test pulse 19 with a test pulse width 79. The test pulse width 79 may be very short compared to both the afterglow phase of the pulse period 717 and bias pulses applied during an associated plasma process, such as the delayed bias pulses described herein. The pulse period 717 may be repeated cyclically (e.g. step 605) in order to apply more test pulses.

Each BP test pulse 19 is separated from a corresponding SP pulse 12 by a time interval 76. A BP off-time 78 represents the remainder of the pulse period 717 after the BP test pulse 19 during which the bias power is off. However, as shown in the third pulse period 717 of the schematic timing diagram 701, when there are multiple test pulses in the same pulse period (e.g. separated by a test pulse separation 77 which may be constant or vary from pulse to pulse and period to period), the BP off-time 78 of each BP test pulse 19 does not indicate that the bias power stays off the entire time because it is turned on for other test pulses.

Each BP test pulse 19 causes measurable effects in the plasma. For example, the voltage response–$V_{pp}$ (indicating, e.g., the plasma potential) may be measured and compared to a model voltage response 71 (e.g. a voltage response predicted by theory or previous experimentation). The measurable effects of the test pulses can advantageously be used to determine diffusion time constants for ionic species in the plasma.

For example, an RF power pulse or a DC pulse maybe applied to a substrate holder (e.g. a stage) to initiate self-biased voltage (correlating with $V_{pp}$). The pulse power (or amplitude) and duration of the pulse may be kept low to minimize any unwanted effects (e.g. etching) of the substrate. The pulse probe RF power may range from about 1 W to about 10 W, or may be higher, such as 100 s of watts. If a fixed pulse probe DC voltage is used, the DC voltage may range from about 10 V to about 100 V, or may be higher, such as up to 1000 V. The lower boundary of the test pulse width 79 may be about 1 µs to allow Child sheath formation. In various embodiments, the test pulse width 79 ranges from about 1 µs to about 1 ms, and ranges from about 1 µs to about 50 µs in some embodiments.

The BP test pulse 19 may be applied at numerous points in time over the pulse period 717 to get the $V_{pp}$ distribution as a function of time (e.g. fixed RF probe power), or probe pulse current distribution in time. Higher plasma densities may result in lower $V_{pp}$ values (at a fixed probe pulse power) or/and in higher probe currents. $V_{pp}$ and probe current trends can help retrieve the (ambipolar) ion diffusion time in the chamber (e.g. for the heavier ion $B^+$).

One specific example method utilizing the process parameter metrology sequence 700 includes generating plasma (e.g. plasma 42 as described herein) by coupling a first SP pulse (e.g. the SP pulse 12 as shown in FIG. 7) to a plasma processing chamber (e.g. plasma processing chamber 44 as described herein) containing a substrate holder (e.g. substrate holder 45 as described herein) configured to support a substrate (e.g. substrate holder 45 as described herein). The plasma is contained in the plasma processing chamber and includes first ions $A^+$ having a first mass $M_{A+}$ and second ions $B^+$ having a second mass $M_{B+}$ greater than the first mass $M_{A+}$.

The method of this specific example further includes collecting measurements (such as voltage response $-V_{pp}$ using at least one BP test pulse 19 or other measurements as described herein) indicative of ion density $n_A$, $n_B$ in the plasma, calculating a delay (e.g. delay 116 or others) according to ion diffusion time constants $\tau_{A+}$, $\tau_{B+}$ determined from the measurements where the delay is between a second SP pulse and a BP pulse (e.g. between the SP pulse 12 and the BP pulse 14 as shown in FIG. 1 and others). $-V_{pp}$ indicates the sheath voltage which correlates with the plasma density at given conditions.

Plasma including the first ions $A^+$ and the second ions $B^+$ is then generated by coupling the second SP pulse to the plasma processing chamber and an energetic ion flux of ions comprising the second ions $B^+$ to the substrate is delivered by applying the BP pulse to the substrate holder after the delay.

The collection of measurements may be performed in various ways and may depend on the specific type of measurements and the details of a given plasma processing apparatus. In one embodiment, collecting the measurements includes applying a plurality of bias power test pulses (i.e. more than one BP test pulse 19) to a substrate holder where each of the bias power test pulses causes a voltage response from a plasma contained in a plasma processing chamber. The voltage response from each of the plurality of bias power test pulses may be measured.

In some cases, more than one afterglow phase may be needed to obtain the desired measurements. For this reason, a plurality of SP pulses (i.e. more than one SP pulse 12) may be coupled to the plasma processing chamber, each generating plasma comprising $A^+$ and $B^+$ ions. Each of the BP test pulses may then be applied after a corresponding time interval 76 between a given BP test pulse 14 and a corresponding SP pulse 12. As shown above, the correspondence between SP pulses and BP test pulses may be one-to-one or may be one-to-multiple.

The process parameter metrology sequence 700 may be performed as a preliminary sequence preceding a plasma process in some applications. For example, any of the plasma processes (such as the plasma process 100 described using FIG. 1) may be performed after the process parameter metrology sequence 700 using the obtained ion diffusion time constant information.

Figure 8:
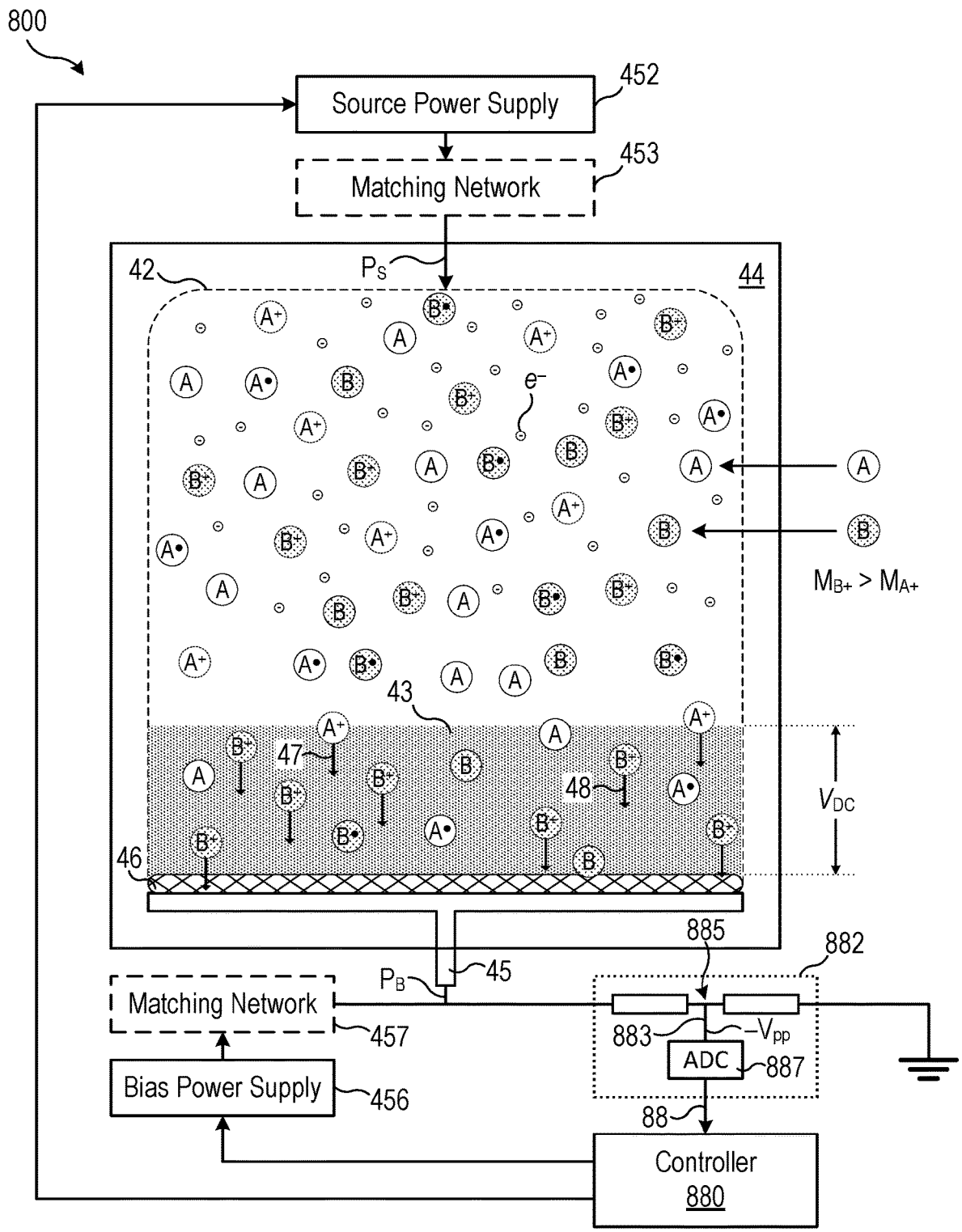
FIG. 8 illustrates a schematic diagram of an example plasma processing apparatus that includes a metrology component with a voltage divider used to measure a voltage response in accordance with embodiments of the invention.

FIG. 8 illustrates a schematic diagram of an example plasma processing apparatus that includes a metrology component with a voltage divider used to measure a voltage response in accordance with embodiments of the invention. The plasma processing apparatus of FIG. 8 may be a specific implementation of other plasma processing apparatuses described herein, such as the plasma processing apparatus of FIG. 4, for example, and may be used to perform any of the plasma processes described herein, such as the plasma process of FIG. 1. Similarly labeled elements may be as previously described.

Referring to FIG. 8, a plasma processing apparatus 800 includes a plasma 42 contained within a plasma processing chamber 44. The plasma processing apparatus 800 is a specific implementation of the plasma processing apparatus 400 that includes a metrology component 882 coupled to a substrate holder 45 supporting a substrate 46. The metrology component 882 is coupled to a bias power supply 456 and a controller 880. The bias power supply 456 may be configured to apply a plurality of bias power test pulses to the substrate holder 45 where each of the plurality of bias power test pulses causes a voltage response $-V_{pp}$ from the plasma 42.

Specifically, the metrology component 882 is operatively coupled to the plasma 42 and configured to collect measurements indicative of ion density in the plasma 42. For example, the metrology component may be configured to measure the voltage response $-V_{pp}$ from each of a plurality of bias power test pulses. The controller 880 is in turn coupled to the bias power supply 456 and the source power supply 452 and is configured to control pulse timing of SP pulses and BP pulses (e.g. delayed BP pulses as described herein) that are applied to the plasma processing chamber 44 during a plasma process.

The controller 880 may also be configured to collect measurements and calculate a delay between the SP pulses and the BP pulses according to ion diffusion time constants determined from the measurements. For example, the controller 880 may be configured to calculate the delay by determining the ion diffusion time constant $n_{A+}$ of a first species $A^+$ and the ion diffusion time constant $n_{B+}$ of a second species ($B^+$) by comparing the measurements to diffusion time constants predicted by the mass $M_{A+}$ and the mass $M_{B+}$ respectively. The controller 880 may then be configured to select a delay that is greater than the diffusion time constant $n_{A+}$ so that the energetic flux of ions has a predetermined value. For example, the ratio of $B^+$ ions to $A^+$ ions may be greater than one relative to a normalized ion density ratio at the end of an applied SP pulse (i.e. because the ion density ratio B:A is greater than one during the application of the BP pulses).

The metrology component 882 includes a voltage divider 885 that is coupled to the substrate holder 45 and sends measurements 883 to the controller 880. For example, the measurements 883 may include a voltage response $-V_{pp}$ as shown here. The voltage response $-V_{pp}$ may be an analog voltage signal and the metrology component 882 may further include an ADC 887 (analog-to-digital converter) configured to convert the analog voltage signal to a digital voltage signal 88 that is provided to (i.e. received by) the controller 880. The ADC 887 may be coupled between the voltage divider 885 and the controller 880.

The voltage divider 885 may advantageously be located farther from the substrate holder 45 (e.g. ESC). For example, the voltage divider 885 may be in the optional bias impedance matching network 457 in some implementations. However, the voltage divider 885 may provide measurements that are somewhat different from reality because of the phase difference.

Figure 9:
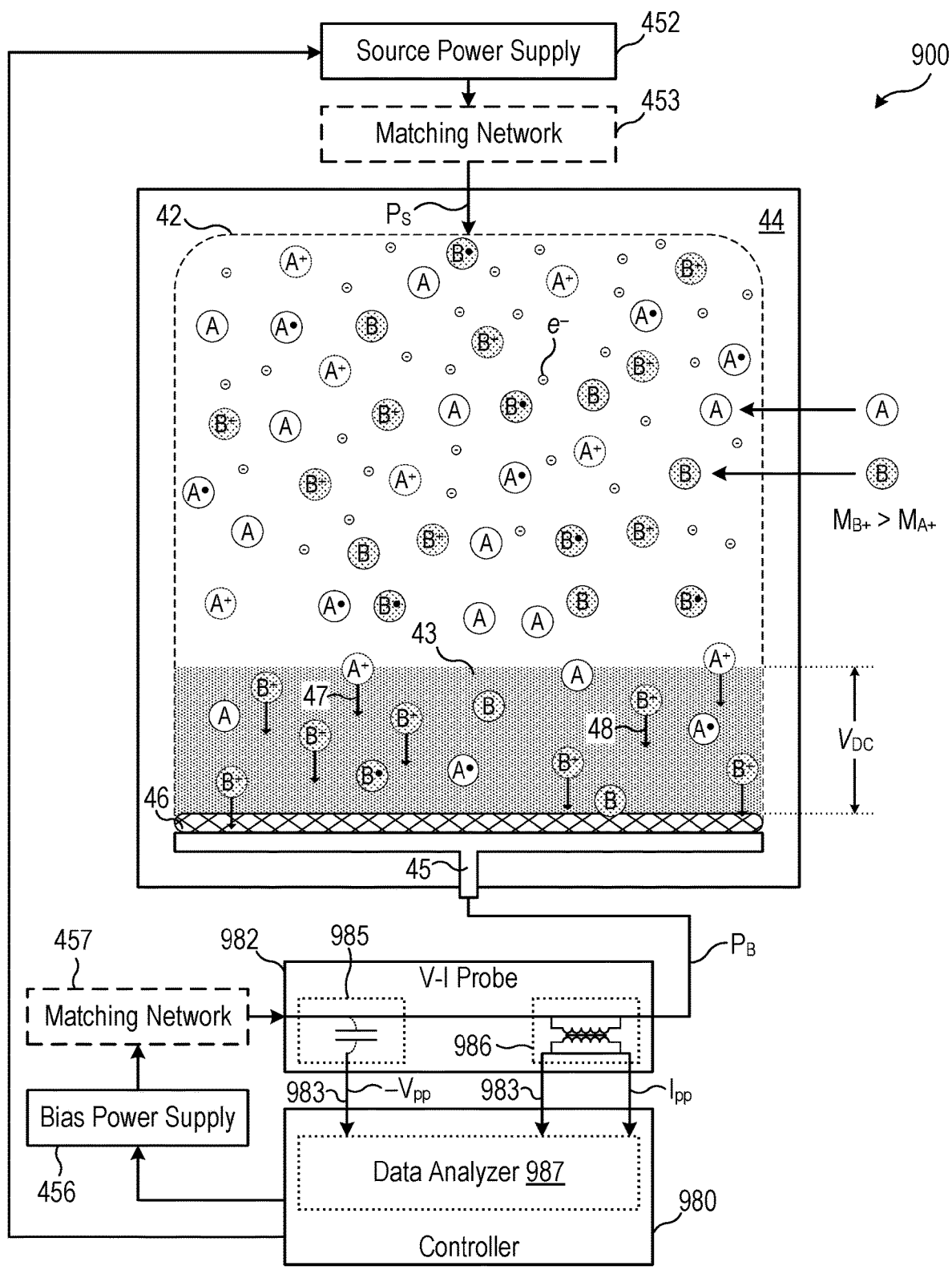
FIG. 9 illustrates a schematic diagram of an example plasma processing apparatus that includes a metrology component with a V-I probe used to measure a voltage response and a current response in accordance with embodiments of the invention.

FIG. 9 illustrates a schematic diagram of an example plasma processing apparatus that includes a metrology component with a V-I probe used to measure a voltage response and a current response in accordance with embodiments of the invention. The plasma processing apparatus of FIG. 9 may be a specific implementation of other plasma processing apparatuses described herein, such as the plasma processing apparatus of FIG. 4, for example, and may be used to perform any of the plasma processes described herein, such as the plasma process of FIG. 1. Similarly labeled elements may be as previously described.

Referring to FIG. 9, a plasma processing apparatus 900 includes a plasma 42 contained within a plasma processing chamber 44 as before. The plasma processing apparatus 900 is a specific implementation of the plasma processing apparatus 400 that includes a metrology component 982 that has a V-I probe coupled between a substrate holder 45 and bias power supply 456.

The metrology component 982 is similar to the metrology component 882 in that it measures a voltage response $-V_{pp}$ as part of measurements 983, but the details of the voltage measurement are different in this example and a current response $I_{pp}$ is also included in the measurements 983. For example, the V-I probe of the metrology component 982 includes both a voltage sensor 985 (e.g. a capacitive voltage sensor as illustrated, although a resistive voltage divider could also be used) and a current sensor 986 (e.g. and inductive current sensor as shown).

The measurements 983 are sent to the controller 980 and may optionally be provided to a data analyzer 987. The V-I probe may be configured to provide a voltage signal and a current signal to data analyzer 987 of the controller 980. The data analyzer 987 may be included in the controller 980 or separately. In some embodiments, the data analyzer 987 includes one or more ADCs. The data analyzer 987 may also include any number of other components including digital logic.

Compared to a voltage divider, the V-I probe may be located closer to the substrate holder 45 (which may be an advantage in certain circumstances). As a result, there may be minimal corruption of the RF signal. That is, the voltage and current measurements from the V-I probe may have the advantage of being more accurate. In particular, discharge impedance can be measured using the V-I probe which may advantageously be more accurate than ion density measurements.

Figure 10:
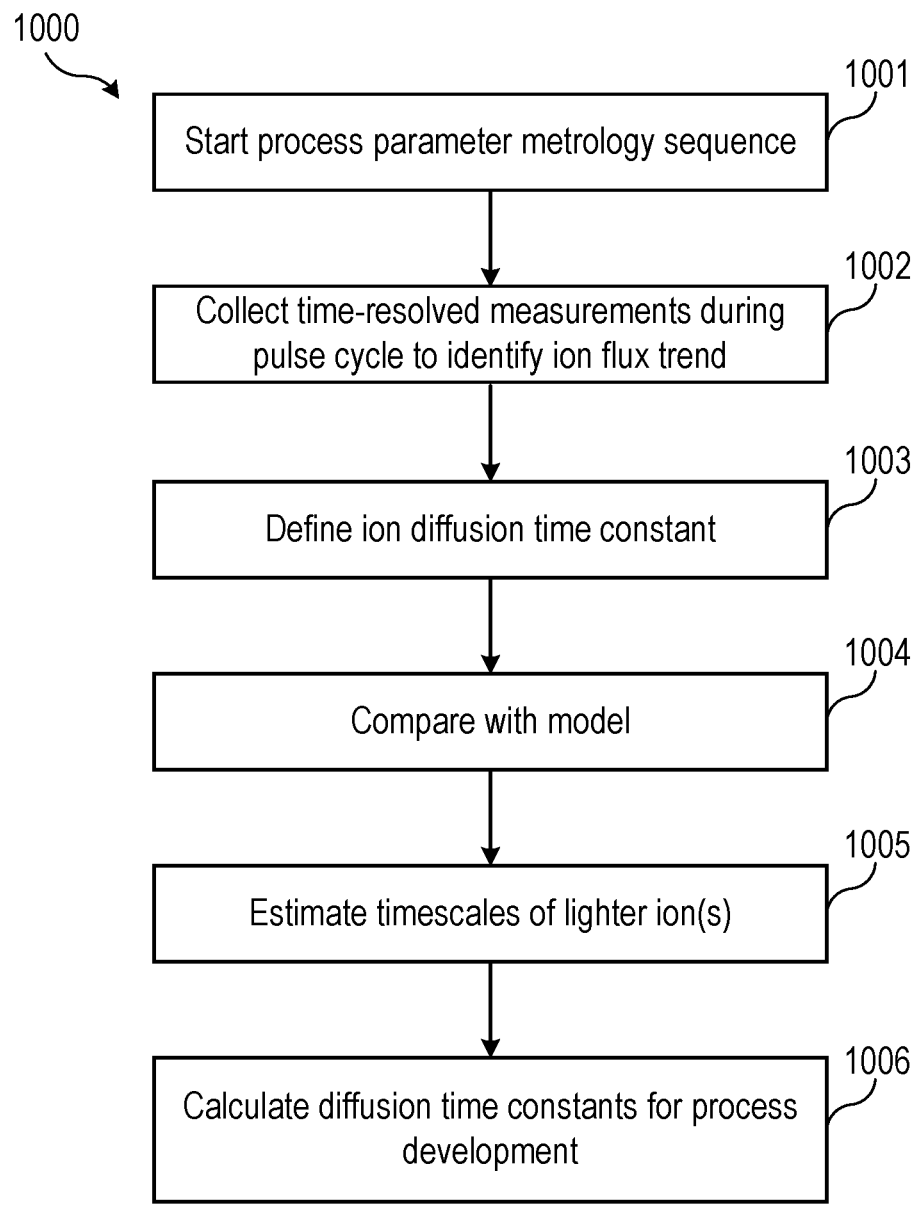
FIG. 10 illustrates an example method of plasma processing utilizing time-resolved measurements within one or more pulse cycles that may be used to calculate ion diffusion time constants for determining plasma process parameters of delayed bias pulses in accordance with embodiments of the invention.
Figure 11:
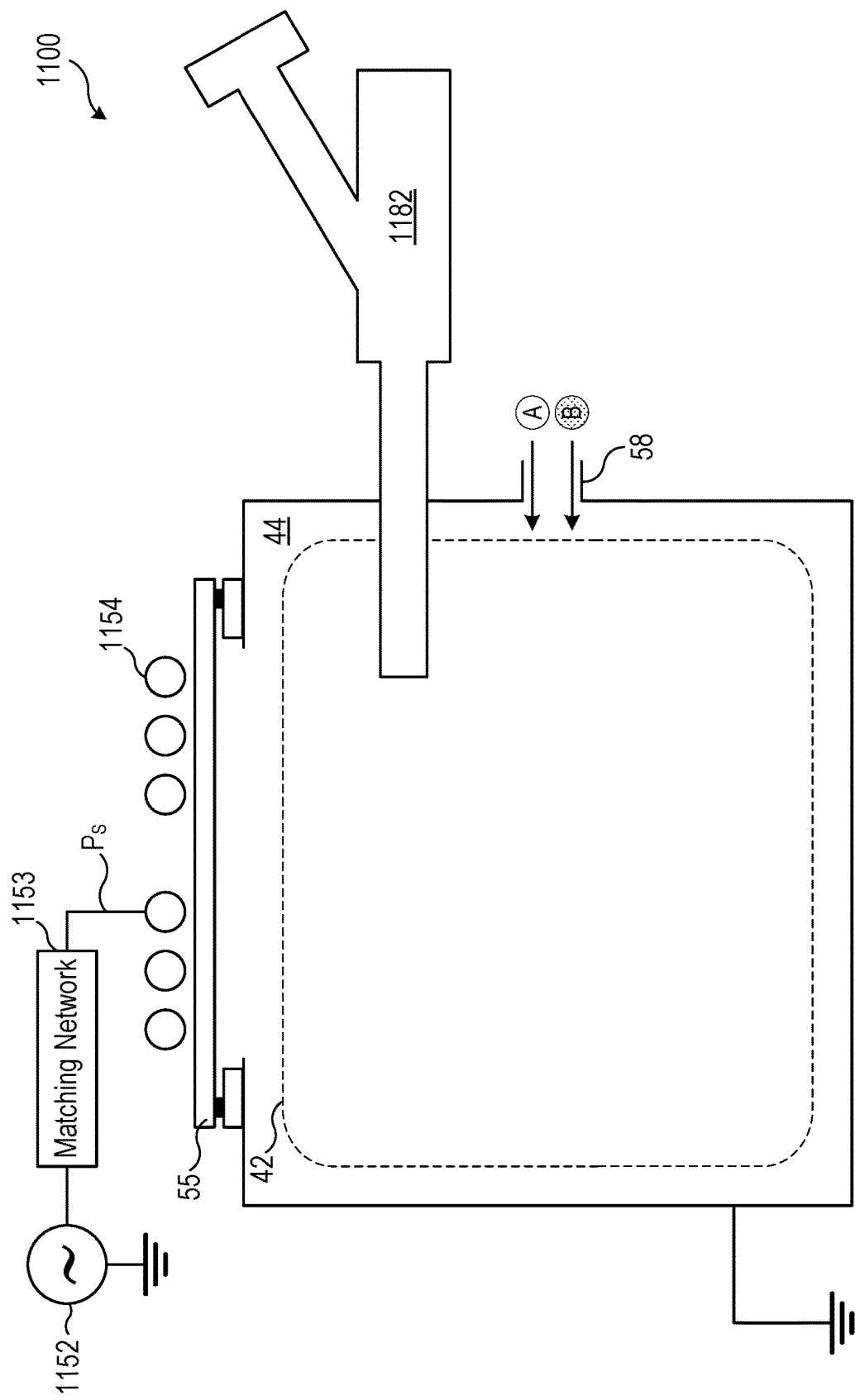
FIG. 11 illustrates a schematic diagram of an example plasma apparatus that includes an external metrology component used to take measurements indicative of ion density in a plasma in accordance with embodiments of the invention.

FIG. 10 illustrates an example method of plasma processing utilizing time-resolved measurements within one or more pulse cycles that may be used to calculate ion diffusion time constants for determining plasma process parameters of delayed bias pulses in accordance with embodiments of the invention. The method of FIG. 10 may be combined with other methods and performed using the systems and apparatuses as described herein. For example, the method of FIG. 10 may be combined with various aspects of any embodiments described using FIGS. 1-9 and 11-15. Although shown in a logical order, the arrangement and numbering of the steps of FIG. 10 are not intended to be limited. The method steps of FIG. 10 may be performed in any suitable order or concurrently with one another as may be apparent to a person of skill in the art.

Referring to FIG. 10, a method 1000 may be used to calculate actual diffusion time constants that may in turn be used to locate delayed bias pulses within the afterglow phase of a plasma in order to deliver the desired flux of heavy ions $B^+$ at a targeted energy and with the desired ion density ratio B:A (i.e. with low or negligible levels of light ions $A^+$). For example, the method 1000 is similar to method 600, but utilizes a broader category of measurements for data collection in step 10002 to calculate the diffusion time constants.

The method 1000 beings at a first step 1001 of starting a process parameter metrology sequence. Time-resolved measurements are collected during one or more pulse cycles to identify ion density trends in step 1002. The measurements may be voltage and/or current responses to test pulses such as those described in the foregoing. However, the measurements may also include measurements such as Langmuir probe measurements or mass spectrometry measurements.

Similar to the method 600, the measurements acquired in step 1002 are used to define the ion diffusion time constant and estimate the diffusion time constant $n_{B+}$ in step 1003, compare $n_{B+}$ to a model in step 1004, and estimate timescales of one or more lighter ions in step 1005. Diffusion time constants may be calculated for use in process development in step 1006. For example, step 1006 may be used to create or refine models that can then be used to develop (e.g. refine or create) other plasma processes or enhance manufacturability control.

FIG. 11 illustrates a schematic diagram of an example plasma apparatus that includes an external metrology component used to take measurements indicative of ion density in a plasma in accordance with embodiments of the invention. The plasma apparatus of FIG. 11 may be used to perform various methods described herein, such as the method of FIG. 10, for example. Similarly labeled elements may be as previously described.

Referring to FIG. 11, a plasma apparatus 1100 includes a plasma 42 contained within a plasma processing chamber 44. The plasma apparatus 1100 may similar to plasma processing apparatuses, such as the plasma processing apparatus 500, as one example, but may be configured to be used for plasma characterization of conditions similar to those experienced during plasma processing of a substrate. For this reason, a substrate may or may not be included in the plasma processing chamber 44 and bias power may or may not be coupled to the plasma processing chamber 44.

Source power from a RF SP supply 1152 is coupled to the plasma processing chamber 44 to generate the plasma 42 using an SP coupling element 1154. A source impedance matching network 1153 is coupled between the RF SP supply 1152 and the SP coupling element 1154. The plasma 42 may be similar to other plasmas described herein, which facilitates the gathering of information relative to plasma processes by measuring the plasma 42.

A metrology component 1182 is coupled to the plasma processing chamber 44. The metrology component 1182 may of course be any suitable type of metrology component as previously described, but is shown in this specific example to be a metrology component 1182 that is attached to a sidewall of the plasma processing chamber 44 and takes direct measurements of the plasma 42.

In one embodiment, the metrology component 1182 includes a Langmuir probe that is configured to measure ion and electron temperature and density information of the plasma 42. In one embodiment, the metrology component 1182 includes a mass spectrometer which may be an ion mass and energy spectrometer (e.g. a quadrupole mass analyzer). The metrology component 1182 may be used to collect measurements indicative of ion density in the plasma 42.

Figure 12:
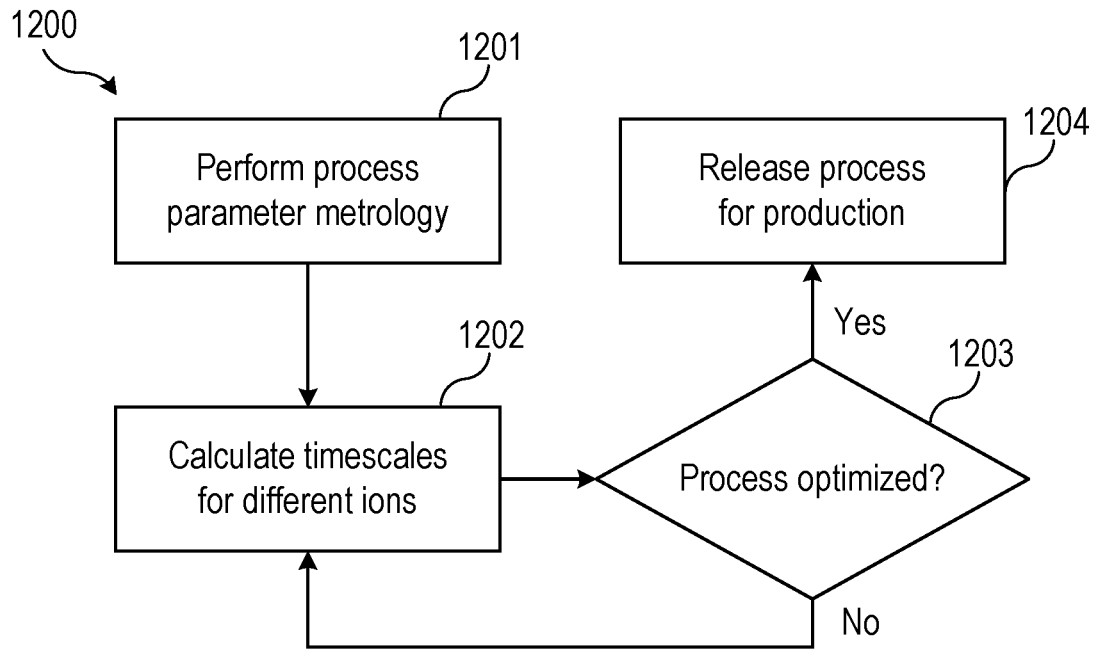
FIG. 12 illustrates an example method of plasma processing that optimizes a plasma process utilizing delayed bias power pulses by calculating diffusion timescales of different ions in accordance with embodiments of the invention.

FIG. 12 illustrates an example method of plasma processing that optimizes a plasma process utilizing delayed bias power pulses by calculating diffusion timescales of different ions in accordance with embodiments of the invention. The method of FIG. 12 may be combined with other methods and performed using the systems and apparatuses as described herein. For example, the method of FIG. 12 may be performed by the plasma processing apparatus of FIG. 4 and may be combined with the plasma process of FIG. 1, for example. Although shown in a logical order, the arrangement and numbering of the steps of FIG. 12 are not intended to be limited. The method steps of FIG. 12 may be performed in any suitable order or concurrently with one another as may be apparent to a person of skill in the art.

Referring to FIG. 12, a method 1200 may be used to optimize a plasma process for a specific application or plasma processing apparatus. Step 1201 is to perform process parameter metrology. This may include various measurements as already discussed in more detail above. From the metrology measurements, timescales of various ions of interest can be calculated in step 1202.

In step 1203, the plasma process is examined to determine if the timescales calculated in step 1202 can be used to improve the optimization of the process. For example, the current process parameters (e.g. pulse timing) may be may be based on purely theoretical parameter values, old parameter values, or parameter values that apply to a different plasma processing apparatus or plasma process. In step 1203, the process is analyzed to determine current process is optimized given the timescales calculated from the metrology results.

If not, process parameter adjustments are made and timescales are again calculated in step 1202. This process may be iterated to converge on the optimized process for a given set of metrology measurements. Once the process is optimized, it may be released for production in step 1204.

Figure 13:
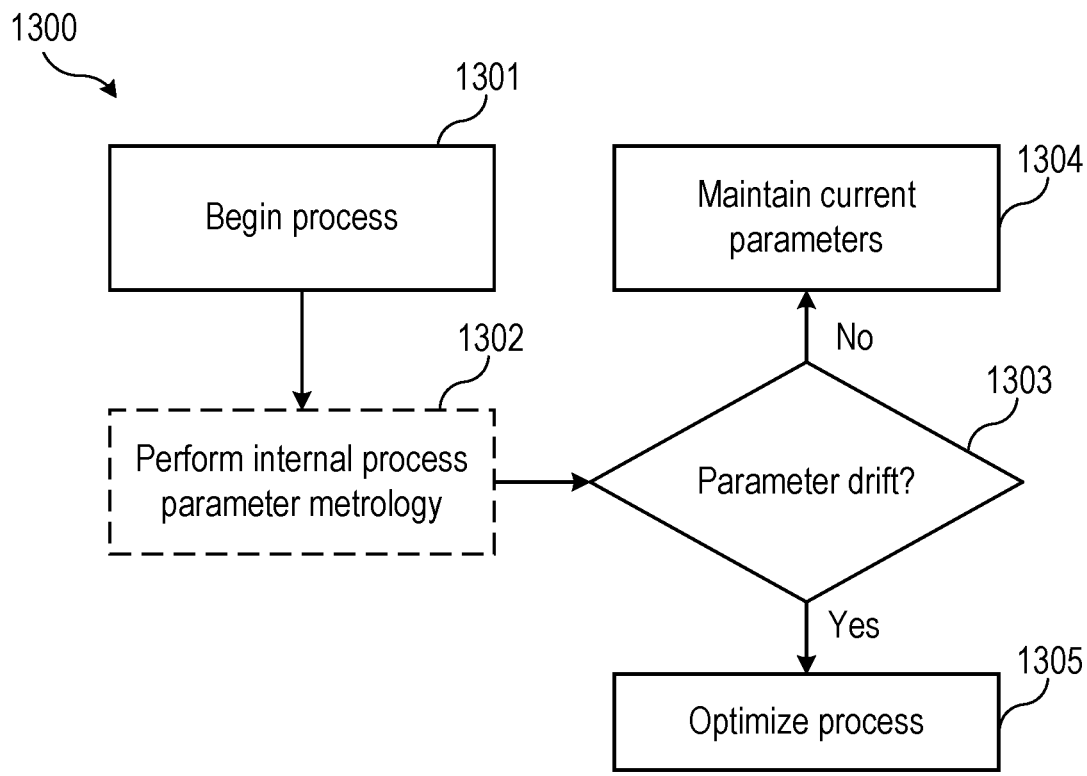
FIG. 13 illustrates an example method of plasma processing that monitors a plasma process utilizing delayed bias power pulses for parameter drift indicating a need to optimize the process in accordance with embodiments of the invention.

FIG. 13 illustrates an example method of plasma processing that monitors a plasma process utilizing delayed bias power pulses for parameter drift indicating a need to optimize the process in accordance with embodiments of the invention. The method of FIG. 13 may be combined with other methods and performed using the systems and apparatuses as described herein. For example, the method of FIG. 13 may be performed by the plasma processing apparatus of FIG. 4 and may be combined with the plasma process of FIG. 1, for example. Although shown in a logical order, the arrangement and numbering of the steps of FIG. 13 are not intended to be limited. The method steps of FIG. 13 may be performed in any suitable order or concurrently with one another as may be apparent to a person of skill in the art.

Referring to FIG. 13, a method 1300 may be used to compensate for parameter drift during a plasma process. Step 1301 is to begin the process. Then, in step 1302, internal process parameter metrology may be performed to monitor process parameters during the process. This may include various measurements as already discussed in more detail above.

In step 1303, the parameters are analyzed to determine if the process is still optimized (e.g. on or more indicators are within an acceptable range or below a certain threshold). If so, the current parameters are maintained for the process (step 1304). However, if one or more parameters have drifted away from acceptable values, then the process has demonstrated instability and can be optimized in step 1305. For example, the method 1200 may be performed as step 1305 if parameter drift is detected.

In some cases, parameter drift may be unlikely since pulse parameters may be based on stable, repeatable values such as ion mass, chamber dimensionality, and plasma temperature (e.g. electron and/or ion temperature). Therefore, a determination of parameter draft may also indicate changes in the system such as chamber contamination. Whether to re-optimize the process or address the underlying issues may depend on the specific details of a given application.

Figure 14:
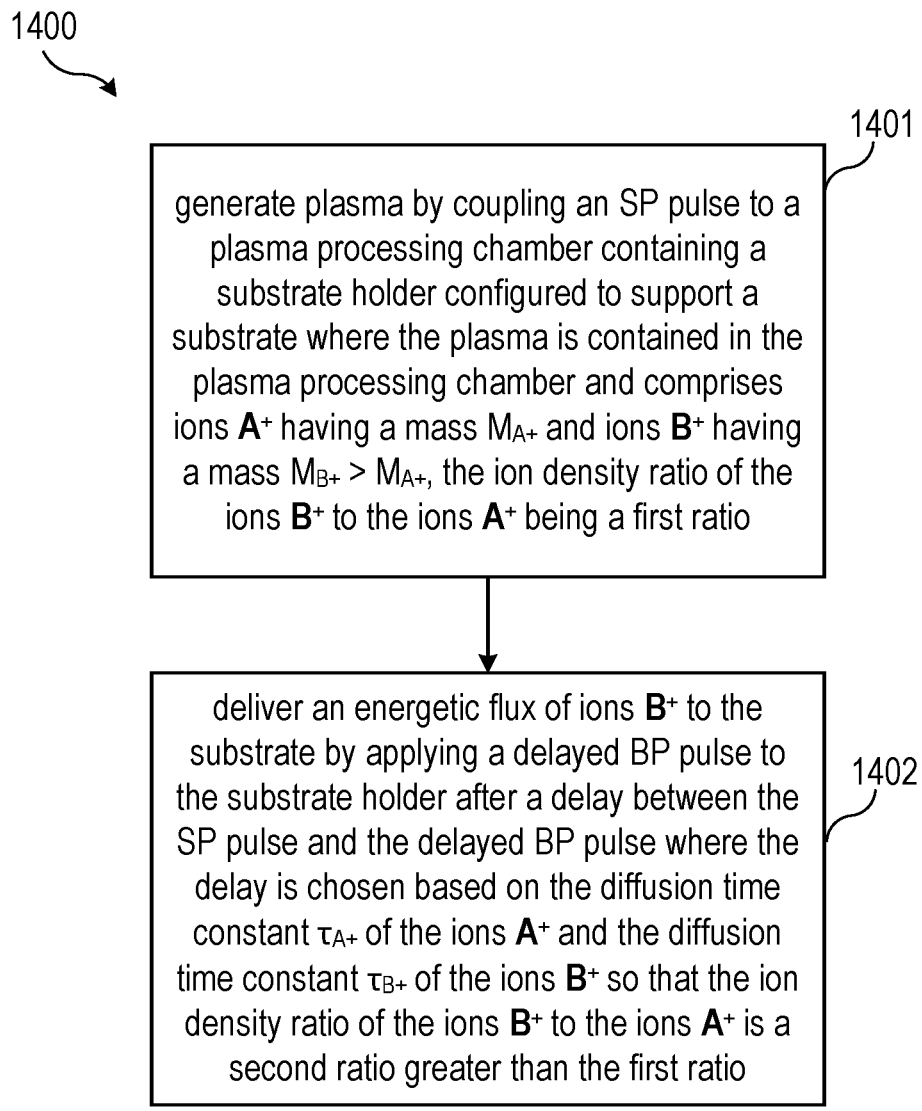
FIG. 14 illustrates an example method of plasma processing utilizing a delayed bias power pulse to deliver an energetic ion flux having an increased flux of heavier ions relative to a flux of lighter ions in accordance with embodiments of the invention.

FIG. 14 illustrates an example method of plasma processing utilizing a delayed bias power pulse to deliver an energetic ion flux having an increased flux of heavier ions relative to a flux of lighter ions in accordance with embodiments of the invention. The method of FIG. 14 may be combined with other methods and performed using the systems and apparatuses as described herein. For example, the method of FIG. 14 may be combined with various aspects of any embodiments described using FIGS. 1-13 and 15. Although shown in a logical order, the arrangement and numbering of the steps of FIG. 14 are not intended to be limited. The method steps of FIG. 14 may be performed in any suitable order or concurrently with one another as may be apparent to a person of skill in the art.

Referring to FIG. 14, step 1401 of a method 1400 of plasma processing is to generate plasma by coupling an SP pulse to a plasma processing chamber. The plasma processing chamber contains a first species A, a second species B, and a substrate holder configured to support a substrate. The plasma is contained in the plasma processing chamber and includes first species ions A$^+$ having a first mass $M_{A+}$ and second species ions B$^+$ having a second mass $M_{B+}$ greater than the first mass $M_{A+}$.

An energetic ion flux of second species ions B$^+$ to the substrate is delivered in step 1402 by applying a delayed BP pulse to the substrate holder after a delay between the SP pulse and the delayed BP pulse. The delay is chosen based on the diffusion time constant $n_{A+}$ of the first species ions A$^+$ and the diffusion time constant $n_{B+}$ of the second species ions B$^+$ to increase the flux of second species ions B$^+$ relative to a flux of first species ions A$^+$.

Figure 15:
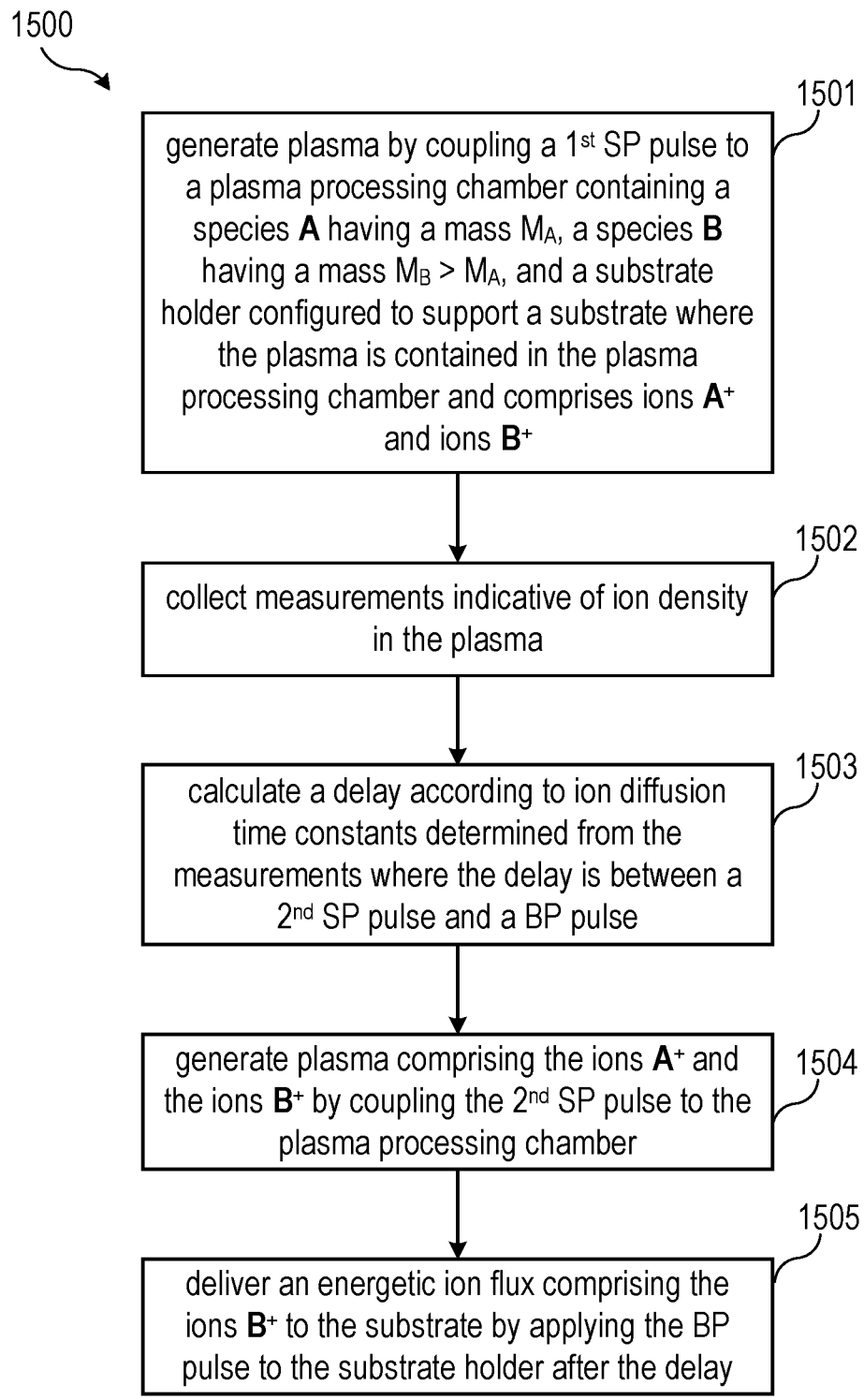
FIG. 15 illustrates an example method of plasma processing utilizing measurements indicative of ion density to calculate a delay according to ion diffusion time constants determined from the measurements and deliver an energetic ion flux of heavier ions in accordance with embodiments of the invention.

FIG. 15 illustrates an example method of plasma processing utilizing measurements indicative of ion density to calculate a delay according to ion diffusion time constants determined from the measurements and deliver an energetic ion flux of heavier ions in accordance with embodiments of the invention. The method of FIG. 15 may be combined with other methods and performed using the systems and apparatuses as described herein. For example, the method of FIG. 15 may be combined with various aspects of any embodiments described using FIGS. 1-14. Although shown in a logical order, the arrangement and numbering of the steps of FIG. 15 are not intended to be limited. The method steps of FIG. 15 may be performed in any suitable order or concurrently with one another as may be apparent to a person of skill in the art.

Referring to FIG. 15, step 1501 of a method 1500 of plasma processing is to generate plasma by coupling a first SP pulse to a plasma processing chamber containing a first species A, a second species B, and a substrate holder configured to support a substrate. The plasma is contained in the plasma processing chamber and includes first species ions A$^+$ having a first mass $M_{A+}$ and second species ions B$^+$ having a second mass $M_{B+}$ greater than the first mass $M_{A+}$.

Measurements indicative of ion density in the plasma are collected in step 1502. In step 1503, a delay is calculated according to ion diffusion time constants determined from the measurements. The delay is between a second SP pulse and a BP pulse. Step 1504 is to generate plasma including the first species ions A$^+$ and the second species ions B$^+$ by coupling the second SP pulse to the plasma processing chamber. An energetic ion flux including the second species ions B$^+$ to the substrate is delivered in step 15054 by applying the BP pulse to the substrate holder after the delay.

Example embodiments of the invention are summarized here. Other embodiments can also be understood from the entirety of the specification as well as the claims filed herein.

Example 1. A method of plasma processing including: generating plasma by coupling a source power pulse to a plasma processing chamber containing a substrate holder configured to support a substrate, the plasma being contained in the plasma processing chamber and including first ions having a first mass and second ions having a second mass greater than the first mass, the ion density ratio of the second ions to the first ions being a first ratio; and delivering an energetic ion flux of second ions to the substrate by applying a delayed bias power pulse to the substrate holder after a delay between the source power pulse and the delayed bias power pulse, the delay being chosen based on the diffusion time constant of the first ions and the diffusion time constant of the second ions so that the ion density ratio of the second ions to the first ions is a second ratio greater than the first ratio.

Example 2. The method of example 1, further including: cyclically repeating generating the plasma and delivering the energetic ion flux of the second ions.

Example 3. The method of one of examples 1 and 2, where the delay is greater than about 20 µs and less than about 200 µs.

Example 4. The method of one of examples 1 to 3, where a threshold ion energy of the first ions to etch a mask of the substrate is lower than a threshold ion energy of the second ions to etch a target material of the substrate.

Example 5. The method of one of examples 1 to 4, where the second ions are ions of an inert species.

Example 6. The method of example 5, where the second ions include krypton (Kr).

Example 7. The method of one of examples 1 to 6, where the first ions are ions of a reactive species.

Example 8. The method of example 7, where the first ions include a halogen.

Example 9. The method of one of examples 1 to 8, further including: while generating the plasma, delivering a glow phase energetic ion flux including the first ions and the second ions to the substrate by applying a glow phase bias power pulse to the substrate holder.

Example 10. The method of one of examples 1 to 9, after generating the plasma and before delivering the energetic ion flux of second ions, delivering an early afterglow energetic ion flux including the first ions and the second ions to the substrate by applying an early afterglow bias power pulse to the substrate holder.

Example 11. A method of plasma processing including: generating plasma by coupling a first source power pulse to a plasma processing chamber containing a substrate holder configured to support a substrate, the plasma being contained in the plasma processing chamber and including first ions having a first mass and second ions having a second mass greater than the first mass; collecting measurements indicative of ion density in the plasma; calculating a delay according to ion diffusion time constants determined from the measurements, the delay being between a second source power pulse and a bias power pulse; generating plasma including the first ions and the second ions by coupling the second source power pulse to the plasma processing chamber; and delivering an energetic ion flux including the second ions to the substrate by applying the bias power pulse to the substrate holder after the delay.

Example 12. The method of example 11, where collecting the measurements includes applying a plurality of bias power test pulses to the substrate holder, each of the plurality of bias power test pulses causing a voltage response from the plasma, and measuring the voltage response from each of the plurality of bias power test pulses.

Example 13. The method of example 12, further including: generating plasma including the first ions and the second ions by coupling a plurality of source power pulses to the plasma processing chamber, the plurality of source power pulses including the first source power pulse; and where applying the plurality of bias power test pulses to the substrate includes applying each bias power test pulse of the plurality of bias power test pulses after a corresponding time interval between the bias power test pulse and a corresponding source power pulse of the plurality of source power pulses.

Example 14. The method of one of examples 11 to 13, where calculating the delay includes determining the ion diffusion time constant of the first ions and the ion diffusion time constant of the second ions by comparing the measurements to diffusion time constants predicted by the first mass and the second mass respectively, and selecting a delay that is greater than the ion diffusion time constant of the first species so that the energetic ion flux includes a ratio of the second ions to the first ions that is greater than a predetermined value.

Example 15. The method of example 14, where comparing the measurements to diffusion time constants predicted by the first mass and the second mass respectively includes comparing the measurements to diffusion time constants predicted by the radius of the plasma processing chamber divided by the square root of the electron temperature of the plasma and multiplied by the square root of the first mass and the second mass respectively.

Example 16. A plasma processing apparatus including: a plasma processing chamber configured to contain a plasma including first ions having a first mass and second ions having a second mass greater than the first mass; a source power supply configured to couple source power pulses to the plasma processing chamber to generate the plasma; a metrology component operatively coupled to the plasma and configured to collect measurements indicative of ion density in the plasma; a controller coupled to the metrology component and configured to calculate a delay according to ion diffusion time constants determined from the measurements, the delay being between a source power pulse and a bias power pulse; a substrate holder disposed within the plasma processing chamber and configured to support a substrate; and a bias power supply coupled to the controller and the substrate, the bias power supply being configured to apply the bias power pulse to the substrate holder after the delay to deliver an energetic ion flux including the second ions to the substrate.

Example 17. The plasma processing apparatus of example 16, where the bias power supply is further configured to apply a plurality of bias power test pulses to the substrate holder, each of the plurality of bias power test pulses causing a voltage response from the plasma, and where the metrology component is further configured to measure the voltage response from each of the plurality of bias power test pulses while collecting the measurements.

Example 18. The plasma processing apparatus of one of examples 16 and 17, where the controller is configured to calculate the delay by determining the ion diffusion time constant of the first species and the ion diffusion time constant of the second species by comparing the measurements to diffusion time constants predicted by the first mass and the second mass respectively, and selecting a delay that is greater than the diffusion time constant of the first species so that the energetic ion flux includes a ratio of the second ions to the first ions that is greater than a predetermined value.

Example 19. The plasma processing apparatus of one of examples 16 to 18, where the metrology component includes a voltage divider coupled to the substrate holder, and an analog-to-digital converter coupled between the voltage divider and the controller, and configured to convert an analog voltage signal received from the voltage divider to a digital voltage signal received by the controller.

Example 20. The plasma processing apparatus of one of examples 16 to 19, where the metrology component includes a V-I probe coupled to the substrate holder, and configured to provide a voltage signal and a current signal to a data analyzer of the controller.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma processing comprising:
    generating plasma by coupling a source power pulse to a plasma processing chamber containing a substrate holder configured to support a substrate, the plasma being contained in the plasma processing chamber and comprising first ions having a first mass and second ions having a second mass greater than the first mass, an ion density ratio of the second ions to the first ions being a first ratio; and
    delivering an energetic ion flux of the second ions to the substrate by applying a delayed bias power pulse to the substrate holder after a delay between the source power pulse and the delayed bias power pulse, the delay being chosen based on a diffusion time constant of the first ions and a diffusion time constant of the second ions so that the ion density ratio of the second ions to the first ions is a second ratio greater than the first ratio.

2. The method of claim 1, further comprising:
    cyclically repeating generating the plasma and delivering the energetic ion flux of the second ions.

3. The method of claim 1, wherein the delay is greater than about 20 μs and less than about 200 μs.

4. The method of claim 1, wherein a threshold ion energy of the first ions to etch a mask of the substrate is lower than a threshold ion energy of the second ions to etch a target material of the substrate.

5. The method of claim 1, wherein the second ions are ions of an inert species.

6. The method of claim 5, wherein the second ions comprise krypton (Kr).

7. The method of claim 1, wherein the first ions are ions of a reactive species.

8. The method of claim 7, wherein the first ions comprise a halogen.

9. The method of claim 1, further comprising:
    while generating the plasma, delivering a glow phase energetic ion flux comprising the first ions and the second ions to the substrate by applying a glow phase bias power pulse to the substrate holder.

10. The method of claim 1, further comprising:
    after generating the plasma and before delivering the energetic ion flux of the second ions, delivering an early afterglow energetic ion flux comprising the first ions and the second ions to the substrate by applying an early afterglow bias power pulse to the substrate holder.

11. A method of plasma processing comprising:
    generating plasma by coupling a first source power pulse to a plasma processing chamber containing a substrate holder configured to support a substrate, the plasma being contained in the plasma processing chamber and comprising first ions having a first mass and second ions having a second mass greater than the first mass;
    collecting measurements indicative of ion density in the plasma;
    calculating a delay according to ion diffusion time constants determined from the measurements, the delay being between a second source power pulse and a bias power pulse;
    generating plasma comprising the first ions and the second ions by coupling the second source power pulse to the plasma processing chamber; and
    delivering an energetic ion flux comprising the second ions to the substrate by applying the bias power pulse to the substrate holder after the delay.

12. The method of claim 11, wherein collecting the measurements comprises
    applying a plurality of bias power test pulses to the substrate holder, each of the plurality of bias power test pulses causing a voltage response from the plasma, and
    measuring the voltage response from each of the plurality of bias power test pulses.

13. The method of claim 12, further comprising:
    generating plasma comprising the first ions and the second ions by coupling a plurality of source power pulses to the plasma processing chamber, the plurality of source power pulses comprising the first source power pulse; and
    wherein applying the plurality of bias power test pulses to the substrate comprises
        applying each bias power test pulse of the plurality of bias power test pulses after a corresponding time interval between the bias power test pulse and a corresponding source power pulse of the plurality of source power pulses.

14. The method of claim 11, wherein calculating the delay comprises
    determining an ion diffusion time constant of the first ions and an ion diffusion time constant of the second ions by comparing the measurements to diffusion time constants predicted by the first mass and the second mass, respectively, and
    selecting a delay that is greater than the ion diffusion time constant of the first ions so that the energetic ion flux comprises a ratio of the second ions to the first ions that is greater than a predetermined value.

15. The method of claim 14, wherein comparing the measurements to the diffusion time constants predicted by the first mass and the second mass respectively comprises comparing the measurements to the diffusion time constants predicted by the radius of the plasma processing chamber divided by the square root of the electron temperature of the plasma and multiplied by the square root of the first mass and the second mass, respectively.

16. A method of plasma processing comprising:
    generating plasma by coupling a source power pulse to a plasma processing chamber containing a substrate holder configured to support a substrate, the plasma being contained in the plasma processing chamber and comprising first ions of a reactive species having a first mass and second ions of an inert species having a second mass greater than the first mass, an ion density ratio of the second ions to the first ions being a first ratio; and
    delivering an energetic ion flux of the second ions to the substrate by applying a delayed bias power pulse to the substrate holder after a delay between the source power pulse and the delayed bias power pulse, the delay being chosen based on a diffusion time constant of the first ions and a diffusion time constant of the second ions so that the ion density ratio of the second ions to the first ions is a second ratio greater than the first ratio.

17. The method of claim 16, further comprising:
    generating plasma comprising the first ions and the second ions by coupling a previous source power pulse to the plasma processing chamber;

collecting measurements indicative of ion density in the plasma by
applying a plurality of bias power test pulses to the substrate holder, each of the plurality of bias power test pulses causing a voltage response from the plasma, and
measuring the voltage response from each of the plurality of bias power test pulses; and
calculating the delay according to the ion diffusion time constants as determined from the measurements.

18. The method of claim 16, wherein the first ions comprise a halogen and the second ions comprise krypton (Kr).

19. The method of claim 16, further comprising:
while generating the plasma, delivering a glow phase energetic ion flux comprising the first ions and the second ions to the substrate by applying a glow phase bias power pulse to the substrate holder.

20. The method of claim 16, further comprising:
after generating the plasma and before delivering the energetic ion flux of the second ions, delivering an early afterglow energetic ion flux comprising the first ions and the second ions to the substrate by applying an early afterglow bias power pulse to the substrate holder.

* * * * *